United States Patent
Kang et al.

(10) Patent No.: US 8,193,011 B2
(45) Date of Patent: Jun. 5, 2012

(54) THIN FILM DEPOSITION APPARATUS AND METHOD OF MANUFACTURING ORGANIC LIGHT-EMITTING DISPLAY DEVICE BY USING THE SAME

(75) Inventors: Hee-Cheol Kang, Yongin (KR); Hyun-Sook Park, Yongin (KR); Jae-Kwang Ryu, Yongin (KR); Yong-Sup Choi, Yongin (KR); Yun-Mi Lee, Yongin (KR); Sang-Soo Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 13/277,112

(22) Filed: Oct. 19, 2011

(65) Prior Publication Data

US 2012/0083061 A1   Apr. 5, 2012

Related U.S. Application Data

(62) Division of application No. 12/862,153, filed on Aug. 24, 2010.

(30) Foreign Application Priority Data

Aug. 24, 2009 (KR) .................. 10-2009-0078175
Feb. 8, 2010 (KR) .................. 10-2010-0011479

(51) Int. Cl.
*H01L 33/26* (2010.01)
*C23C 16/44* (2006.01)
*H01L 21/76* (2006.01)
*C23C 16/00* (2006.01)

(52) U.S. Cl. ............. 438/22; 257/E33.013; 204/297.01; 204/298.35; 279/128; 427/251; 427/255.5; 427/458

(58) Field of Classification Search .................... 438/22; 257/E33; 279/128; 361/234; 414/935
See application file for complete search history.

(56) References Cited

U.S. PATENT DOCUMENTS

| | | | |
|---|---|---|---|
| 5,487,609 | A | 1/1996 | Asada |
| 6,274,198 | B1 | 8/2001 | Dautartas |

(Continued)

FOREIGN PATENT DOCUMENTS

EP    1 413 644 A2    4/2004

(Continued)

OTHER PUBLICATIONS

U.S. Office action dated Jun. 21, 2011, for U.S. Appl. No. 12/862,153, 21 pages.

(Continued)

*Primary Examiner* — Karla Moore
*Assistant Examiner* — Nathan K Ford
(74) *Attorney, Agent, or Firm* — Christie, Parker & Hale, LLP

(57) ABSTRACT

A thin film deposition apparatus and an organic light-emitting display device by using the same. The thin film deposition apparatus includes an electrostatic chuck, a plurality of chambers; at least one thin film deposition assembly; a carrier; a first power source plug; and a second power source plug. The electrostatic chuck includes a body having a supporting surface that contacts a substrate to support the substrate, wherein the substrate is a deposition target; an electrode embedded into the body and applying an electrostatic force to the supporting surface; and a plurality of power source holes formed to expose the electrode and formed at different locations on the body.

6 Claims, 15 Drawing Sheets

U.S. PATENT DOCUMENTS

| | | | |
|---|---|---|---|
| 6,371,451 | B1 | 4/2002 | Choi |
| 6,749,906 | B2 | 6/2004 | Van Slyke |
| 6,995,035 | B2 | 2/2006 | Cok et al. |
| 7,964,037 | B2 | 6/2011 | Fukuda et al. |
| 2001/0006827 | A1 | 7/2001 | Yamazaki et al. |
| 2002/0076847 | A1 | 6/2002 | Yamada et al. |
| 2002/0168577 | A1 | 11/2002 | Yoon |
| 2002/0194727 | A1 | 12/2002 | Cho et al. |
| 2003/0101937 | A1 | 6/2003 | Van Slyke et al. |
| 2003/0168013 | A1 | 9/2003 | Freeman et al. |
| 2003/0221614 | A1 | 12/2003 | Kang et al. |
| 2003/0232563 | A1 | 12/2003 | Kamiyama et al. |
| 2004/0127066 | A1 | 7/2004 | Jung |
| 2004/0134428 | A1 | 7/2004 | Sasaki et al. |
| 2004/0142108 | A1 | 7/2004 | Atobe et al. |
| 2004/0144321 | A1 | 7/2004 | Grace et al. |
| 2004/0194702 | A1 | 10/2004 | Sasaki et al. |
| 2005/0016461 | A1 | 1/2005 | Klug et al. |
| 2005/0031836 | A1 | 2/2005 | Hirai |
| 2005/0037136 | A1 | 2/2005 | Yamamoto |
| 2005/0166842 | A1 | 8/2005 | Sakamoto |
| 2005/0263074 | A1 | 12/2005 | Masuda et al. |
| 2006/0144325 | A1 | 7/2006 | Jung et al. |
| 2006/0164786 | A1* | 7/2006 | Kobayashi et al. ............ 361/234 |
| 2006/0174829 | A1* | 8/2006 | An et al. .................. 118/52 |
| 2006/0205101 | A1 | 9/2006 | Lee et al. |
| 2006/0255722 | A1 | 11/2006 | Imanishi |
| 2006/0278522 | A1 | 12/2006 | Kim et al. |
| 2007/0077358 | A1 | 4/2007 | Jeong et al. |
| 2007/0178708 | A1 | 8/2007 | Ukigaya |
| 2007/0297887 | A1* | 12/2007 | Tanaka ................. 414/591 |
| 2008/0018236 | A1 | 1/2008 | Arai et al. |
| 2008/0115729 | A1 | 5/2008 | Oda et al. |
| 2008/0131587 | A1 | 6/2008 | Boroson et al. |
| 2008/0216741 | A1 | 9/2008 | Ling et al. |
| 2009/0017192 | A1 | 1/2009 | Matsuura |
| 2009/0153033 | A1 | 6/2009 | Lee et al. |
| 2009/0229524 | A1 | 9/2009 | Kim et al. |
| 2009/0232976 | A1 | 9/2009 | Yoon et al. |
| 2010/0156279 | A1 | 6/2010 | Tamura et al. |

FOREIGN PATENT DOCUMENTS

| | | | |
|---|---|---|---|
| EP | 1 518 940 | A1 | 3/2005 |
| JP | 04-272170 | | 9/1992 |
| JP | 2000-068054 | | 3/2000 |
| JP | 2001-052862 | | 2/2001 |
| JP | 2001-093667 | | 4/2001 |
| JP | 2002-175878 | | 6/2002 |
| JP | 2003-003250 | | 1/2003 |
| JP | 2003-077662 | | 3/2003 |
| JP | 2003-157973 | | 5/2003 |
| JP | 2003-297562 | | 10/2003 |
| JP | 2004-043898 | | 2/2004 |
| JP | 2004-103269 | | 4/2004 |
| JP | 2004-103341 | | 4/2004 |
| JP | 2004-199919 | | 7/2004 |
| JP | 2004-342455 | | 12/2004 |
| JP | 2005-044592 | | 2/2005 |
| JP | 2005-235568 | | 9/2005 |
| JP | 2005-293968 | | 10/2005 |
| JP | 2005-296737 | | 10/2005 |
| JP | 2006-275433 | | 10/2006 |
| JP | 2006-307247 | | 11/2006 |
| JP | 2007-047293 | | 2/2007 |
| JP | 2008-019477 | | 1/2008 |
| JP | 2008-121098 | | 5/2008 |
| JP | 2009-019243 | | 1/2009 |
| JP | 2009-087910 | | 4/2009 |
| JP | 2009-117231 | | 5/2009 |
| KR | 1997-0008709 | | 2/1997 |
| KR | 10-0257219 | B1 | 2/2000 |
| KR | 10-2000-0019254 | | 4/2000 |
| KR | 10-2000-0023929 | | 5/2000 |
| KR | 10-2001-0059939 | | 7/2001 |
| KR | 10-2002-0000201 | | 1/2002 |
| KR | 10-2002-0050922 | | 6/2002 |
| KR | 10-2002-0088662 | | 11/2002 |
| KR | 10-2002-0090934 | | 12/2002 |
| KR | 10-0405080 | | 11/2003 |
| KR | 10-0406059 | | 11/2003 |
| KR | 10-2003-0091947 | | 12/2003 |
| KR | 10-2003-0093959 | | 12/2003 |
| KR | 10-2004-0050045 | | 6/2004 |
| KR | 10-2004-0069281 | | 8/2004 |
| KR | 10-2004-0084747 | | 10/2004 |
| KR | 10-0463212 | | 12/2004 |
| KR | 10-0520159 | | 10/2005 |
| KR | 10-2006-0008602 | | 1/2006 |
| KR | 10-2006-0018745 | | 3/2006 |
| KR | 10-2006-0073367 | | 6/2006 |
| KR | 10-2006-0080475 | | 7/2006 |
| KR | 10-2006-0080481 | | 7/2006 |
| KR | 10-2006-0080482 | | 7/2006 |
| KR | 10-2006-0083510 | | 7/2006 |
| KR | 10-2006-0104675 | | 10/2006 |
| KR | 10-2006-0104677 | | 10/2006 |
| KR | 10-2006-0109627 | | 10/2006 |
| KR | 10-0646160 | | 11/2006 |
| KR | 10-0687007 | | 2/2007 |
| KR | 10-0696547 | B1 | 3/2007 |
| KR | 10-0698033 | | 3/2007 |
| KR | 10-0700466 | | 3/2007 |
| KR | 10-2007-0035796 | | 4/2007 |
| KR | 10-0711885 | | 4/2007 |
| KR | 10-0723627 | B1 | 5/2007 |
| KR | 10-2007-0056190 | | 6/2007 |
| KR | 10-0726132 | | 6/2007 |
| KR | 10-0741142 | B1 | 7/2007 |
| KR | 10-2007-0078713 | | 8/2007 |
| KR | 10-2007-0080635 | | 8/2007 |
| KR | 10-2007-0101842 | | 10/2007 |
| KR | 10-2007-0105595 | | 10/2007 |
| KR | 10-0770653 | B1 | 10/2007 |
| KR | 10-2008-0001184 | | 1/2008 |
| KR | 10-0797787 | B1 | 1/2008 |
| KR | 10-0800125 | B1 | 1/2008 |
| KR | 10-0815265 | | 3/2008 |
| KR | 10-0823508 | B1 | 4/2008 |
| KR | 10-0827760 | B1 | 5/2008 |
| KR | 10-0839380 | B1 | 6/2008 |
| KR | 10-2008-0060400 | | 7/2008 |
| KR | 10-2008-0061132 | | 7/2008 |
| KR | 10-2008-0062212 | | 7/2008 |
| KR | 10-2009-0038733 | | 4/2009 |
| KR | 10-0899279 | B1 | 5/2009 |
| KR | 10-2009-0097453 | | 9/2009 |

OTHER PUBLICATIONS

European Search Report dated May 27, 2011, for European Patent Application No. 10251514.5 (11 sheets).

Korean Patent Abstracts, Publication No. 10-0151312 B1, dated Jun. 18, 1998, corresponding to Korean Publication 1997-0008709 listed above.

Korean Patent Abstracts, Publication No. 1020020086047, dated Nov. 18, 2002, for corresponding Korean Patent 10-0405080 listed above.

Korean Patent Abstracts, Publication No. 1020020088662, dated Nov. 29, 2002, for corresponding Korean Patent 10-0463212 listed above.

Korean Patent Abstracts, Publication No. 1020050045619, dated May 17, 2005, for corresponding Korean Patent 10-0520159 listed above.

Korean Patent Abstracts, Publication No. 1020040062203, dated Jul. 7, 2002, for corresponding Korean Patent 10-0646160 listed above.

Korean Patent Abstracts, Publication No. 1020060101987, dated Sep. 27, 2006, for corresponding Korean Patent 10-0687007 listed above.

Korean Patent Abstracts, Publication No. 1020020056238, dated Jul. 10, 2002, for corresponding Korean Patent 10-0698033 listed above.

Korean Patent Abstracts, Publication No. 1020050078637, dated Aug. 5, 2005, for corresponding Korean Patent 10-0700466 listed above.

Korean Patent Abstracts, Publication No. 1020070025164, dated Mar. 8, 2007, for corresponding Korean Patent 10-0711885 listed above.

Korean Patent Abstracts, Publication No. 1020020034272, dated May 9, 2002, for corresponding Korean Patent 10-0726132 listed above.

Korean Patent Abstracts, Publication No. 1020060126267, dated Dec. 6, 2006, for corresponding Korean Patent 10-0797787 listed above.

Korean Patent Abstracts, Publication No. 1020070050793, dated May 16, 2007, for corresponding Korean Patent 10-0815265 listed above.

Korean Patent Abstracts, Publication No. 10-2007-0056241, dated Jun. 4, 2007, corresponding to Korean Patent 10-0741142 B1 listed above.

Korean Patent Abstracts, Publication No. 1020010062735, dated Jul. 7, 2001, for corresponding Korean Patent 10-0827760 listed above.

Korean Patent Abstracts, Publication No. 1020080038650, dated May 7, 2008, for corresponding Korean Patent 10-0839380 listed above.

Korean Patent Abstracts, Publication No. 10-2008-0070302, dated Jul. 30, 2008, corresponding to Korean Patent 10-0899279 B1 listed above.

* cited by examiner

THIN FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATIONS

This application is a divisional of U.S. patent application Ser. No. 12/862,153, filed Aug. 24, 2010 which claims the benefit of and priority to Korean Application No(s). 10-2009-0078175, filed Aug. 24, 2009 and 10-2010-0011479 filed Feb. 8, 2010, in the Korean Intellectual Property Office, the disclosures of which are incorporated herein by reference.

BACKGROUND OF THE INVENTION

1. Field of the Invention

Aspects of the present invention relate to a thin film deposition apparatus and a method of manufacturing an organic light-emitting display device by using the same, and more particularly, to a thin film deposition apparatus that can be simply applied to manufacture large display devices on a mass scale, and a method of manufacturing an organic light-emitting display device by using the thin film deposition apparatus.

2. Description of the Related Art

Organic light-emitting display devices have a larger viewing angle, better contrast characteristics, and a faster response rate than other display devices, and thus have drawn attention as a next-generation display device.

An organic light-emitting display device includes intermediate layers, including an emission layer disposed between a first electrode and a second electrode that are arranged to face each other. The electrodes and the intermediate layers may be formed by using various methods, one of which is a single deposition method. When an organic light-emitting display device is manufactured by using the single deposition method, a fine metal mask (FMM) having the same pattern as a thin film to be formed is disposed to closely contact a substrate, and a thin film material is deposited over the FMM in order to form the thin film having the desired pattern.

However, it is disadvantageous to use an FMM when manufacturing organic light-emitting display devices on a large scale using a large sized mother-glass. When a large mask, such as an FMM, is used for deposition onto a large sized mother-glass, the mask is likely to bend due to the weight thereof, thereby causing a pattern to be distorted. Accordingly, FMMs have disadvantages with respect to the current trend toward high pitch patterning.

Furthermore, in conventional deposition methods, a metal mask is disposed on a first surface of a substrate and a magnet is disposed on a second surface of the substrate while the edges of the substrate are fixed by a chuck, so that the magnet allows the metal mask to contact the first surface. However, since in this case, only the edges of the substrate are supported by the chuck, a central part of the substrate may sag when the substrate is large. The greater the size of the substrate, the greater the likelihood of sagging.

SUMMARY OF THE INVENTION

Aspects of the present invention provide a thin film deposition apparatus that may be simply applied to manufacture large display devices on a mass scale and which may be applied to perform high-pitch patterning, and a method of manufacturing an organic light-emitting display device by using the thin film deposition apparatus.

According to an aspect of the present invention, there is provided a thin film deposition apparatus including an electrostatic chuck, an a plurality of chambers; at least one thin film deposition assembly; a carrier; a first power source plug; and a second power source plug. The electrostatic chuck includes a body having a supporting surface that contacts a substrate to affix the substrate by electrostatic force, wherein the substrate is a deposition target; an electrode embedded into the body and applying an electrostatic force to the supporting surface; and a plurality of power source holes formed to expose the electrode and formed at different locations on the body. The plurality of chambers are maintained in a vacuum state. The at least one thin film deposition assembly is located in at least one of the plurality of chambers, is separated from the substrate by a predetermined distance, and is used to form a thin film on the substrate affixed to the electrostatic chuck. The carrier is used to move the electrostatic chuck to pass through the plurality of chambers. The first power source plug is installed to be attachable to and detachable from one of the power source holes in order to supply power to the electrode. The first power source plug is installed at an upstream of a path in which the electrostatic chuck is moved by the carrier. The second power source plug is installed to be attachable to and detachable from another of the power source holes in order to supply power to the electrode. The second power source plug is installed in the path to be downstream to the first power source plug with respect to the path.

According to a non-limiting aspect, the first and second power source plugs may be disposed in different chambers.

According to a non-limiting aspect, the thin film deposition apparatus may further include an inversion robot disposed in at least one of the plurality of chambers to turn over the electrostatic chuck to which the substrate is affixed; and a third power source plug installed in the inversion robot, the third power source plug installed to be attachable to and detachable from one of the plurality of power source holes in order to supply power to the electrode.

According to a non-limiting aspect, the carrier may include a support installed to extend through the chambers; a plurality of movement bars engaging the support and supporting edges of the electrostatic chuck; and a plurality of driving units each disposed between the support and a respective one of the plurality of movement bars, the plurality of driving units for moving the movement bars along upper surfaces of the support, respectively.

According to a non-limiting aspect, the at least one thin film deposition assembly may include a deposition source for discharging a deposition material; a deposition source nozzle unit disposed at a side of the deposition source and including a plurality of deposition source nozzles arranged in a first direction; and a patterning slit sheet disposed opposite to and spaced apart from the deposition source nozzle unit and including plurality of patterning slits arranged in a second direction perpendicular to the first direction. Deposition may be performed while the substrate is moved relative to the thin film deposition apparatus in the first direction. The deposition source, the deposition source nozzle unit, and the patterning slit sheet may be integrally formed as one body.

According to a non-limiting aspect, the deposition source, the deposition source nozzle unit, and the patterning slit sheet may be integrally connected as one body by a plurality of connection members.

According to a non-limiting aspect, the connection members may be formed to seal a space between the deposition source nozzle unit disposed at the side of the deposition source, and the patterning slit sheet.

According to a non-limiting aspect, the plurality of deposition source nozzles may be tilted at a predetermined angle.

According to a non-limiting aspect, the plurality of deposition source nozzles may include deposition source nozzles arranged in two rows formed in the first direction, and wherein each of the deposition source nozzles in each of the two rows may be tilted at the predetermined angle toward a corresponding deposition source nozzle of the other of the two rows.

According to a non-limiting aspect, the plurality of deposition source nozzles may include deposition source nozzles arranged in two rows formed in the first direction. Deposition source nozzles of a row located at a first side of the patterning slit sheet may be arranged to face a second side of the patterning slit sheet, and the deposition source nozzles of the other row located at the second side of the patterning slit sheet may be arranged to face the first side of the patterning slit sheet.

According to a non-limiting aspect, the at least one thin film deposition assembly may include a deposition source for discharging a deposition material; a deposition source nozzle unit disposed at a side of the deposition source and including a plurality of deposition source nozzles arranged in a first direction; a patterning slit sheet disposed opposite to and spaced apart from the deposition source nozzle unit and including a plurality of patterning slits arranged in the first direction; and a barrier plate assembly disposed between the deposition source nozzle unit and the patterning slit sheet in the first direction, and including a plurality of barrier plates for partitioning a disposition space between the deposition source nozzle unit and the patterning slit sheet into a plurality of sub-deposition spaces. The at least one thin film deposition apparatus may be disposed apart from the substrate by a predetermined distance, and the at least one thin film deposition assembly or the substrate may be moved relative to the other.

According to a non-limiting aspect, the plurality of barrier plates may extend in a second direction that is substantially perpendicular to the first direction.

According to a non-limiting aspect, the barrier plate assembly may include a first barrier plate assembly including a plurality of first barrier plates; and a second barrier plate assembly including a plurality of second barrier plates.

According to a non-limiting aspect, the first barrier plates and the second barrier plates may extend in the second direction.

According to a non-limiting aspect, the first barrier plates may be arranged to correspond to the second barrier plates, respectively.

According to a non-limiting aspect, the deposition source and the barrier plate assembly may be disposed apart from each other.

According to a non-limiting aspect, the barrier plate assembly and the patterning slit sheet may be disposed apart from each other.

According to another aspect of the present invention, there is provided a method of manufacturing an organic light-emitting device, the method including affixing a substrate which is a deposition target to an electrostatic chuck; moving the electrostatic chuck to which the substrate is affixed to pass through a plurality of chambers that are maintained in a vacuum state; inserting a first power source plug into a first power source hole selected from among the plurality of power source holes to supply power to the electrode, where the first power source plug is installed at an upstream of a path in which the electrostatic chuck is moved; inserting a second power source plug into a second power source hole selected from among the plurality of power source holes to supply power to the electrode, where the second power source plug is installed in the path to be downstream from the first power source plug with respect to the path; separating the first power source plug from the first power source hole; and forming an organic layer on the substrate by using a thin film deposition assembly disposed in at least one of the plurality of chambers and by moving the electrostatic chuck supporting the substrate or the thin film deposition assembly relative to the other. The electrostatic chuck includes a body having a supporting surface that contacts the substrate to support the substrate, an electrode embedded into the body and applying an electrostatic force to the supporting surface, and a plurality of power source holes that are formed to expose the electrode and formed at different locations on the body.

According to a non-limiting aspect, the first and second power source plugs may be disposed in different chambers. The second power source plug may be inserted into the second power source hole at the same time that the first power source plug is separated from the first power source hole.

According to a non-limiting aspect, an inversion robot may be located in at least one of the plurality of chambers to turn over the electrostatic chuck that supports the substrate. The method may further include inserting a third power source plug installed in the inversion robot into a third power source hole selected from among the plurality of power source holes; and separating the third power source plug from the third power source hole when the first power source or second power source is inserted into the first or second power source hole.

According to a non-limiting aspect, the thin film deposition assembly may include a deposition source that discharges a deposition material; a deposition source nozzle unit disposed at a side of the deposition source and including a plurality of deposition source nozzles arranged in a first direction; and a patterning slit sheet disposed opposite to and spaced apart from the deposition source nozzle unit and including a plurality of patterning slits arranged in a second direction perpendicular to the first direction. The deposition source, the deposition source nozzle unit, and the patterning slit sheet may be integrally formed as one body, and the thin film deposition assembly may be disposed apart from the substrate so that the depositing of the deposition material is performed while the substrate is moved relative to the thin film deposition apparatus in the first direction.

According to a non-limiting aspect, the thin film deposition assembly may include a deposition source that discharges a deposition material; a deposition source nozzle unit disposed at a side of the deposition source and including a plurality of deposition source nozzles arranged in a first direction; a patterning slit sheet disposed opposite to and spaced apart from the deposition source nozzle unit and including a plurality of patterning slits arranged in the first direction; and a barrier plate assembly disposed between the deposition source nozzle unit and the patterning slit sheet in the first direction, and including a plurality of barrier plates for partitioning a deposition space between the deposition source nozzle unit and the patterning slit sheet into a plurality of sub-deposition spaces. The thin film deposition assembly may be disposed apart from the substrate so that the depositing of the deposition material is performed on the substrate by moving the thin film deposition assembly or the substrate relative to the other.

According to another aspect of the present invention, a thin film deposition apparatus may include an electrostatic chuck including a body having a supporting surface that contacts a substrate to affix the substrate by an electrostatic force, wherein the substrate is a deposition target; an electrode embedded into the body and applying the electrostatic force to the supporting surface; and a plurality of power source holes formed to expose the electrode and formed at different locations on the body; a plurality of chambers that are maintained in a vacuum state; at least one thin film deposition assembly located in at least one of the plurality of chambers and separated from the substrate by a predetermined distance, the at least one thin film deposition assembly being positioned to form a thin film on the substrate affixed to the electrostatic chuck; a carrier that moves the electrostatic chuck along a predetermined path to pass through the plurality of chambers; and a plurality of power source plugs that removably engage the plurality of power source holes to supply power to the electrode of the electrostatic chuck, wherein the plurality of power sources are disposed along the predetermined path through the plurality of chambers such that there is at least one power source plug is engaged with a power source hole at all times as the electrostatic chuck passes through the plurality of chambers.

According to another aspect of the present invention, a method of manufacturing an organic light-emitting device may include affixing a substrate which is a deposition target to an electrostatic chuck, wherein the electrostatic chuck includes a body having a supporting surface that contacts the substrate to affix the substrate by an electrostatic force, an electrode embedded into the body and applying an electrostatic force to the supporting surface, and a plurality of power source holes that are formed to expose the electrode and that are formed at different locations on the body; moving the electrostatic chuck to which the substrate is affixed along a predetermined path to pass through a plurality of chambers that are maintained in a vacuum state; supplying power to the electrode of the electrostatic chuck by engaging the electrostatic chuck with one or more of a plurality power source plugs arranged along the predetermined path and sequentially inserted into and removed from the power source holes such that there is at least one of the plurality of power source plugs engaged with a power source hole at all times when the substrate is affixed to the electrostatic chuck and when the electrostatic chuck passes through the plurality of chambers; and forming an organic layer on the substrate depositing a deposition material from at least one thin film deposition assembly disposed in at least one of the plurality of chambers as the substrate moves through the at least one of the plurality of chambers.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
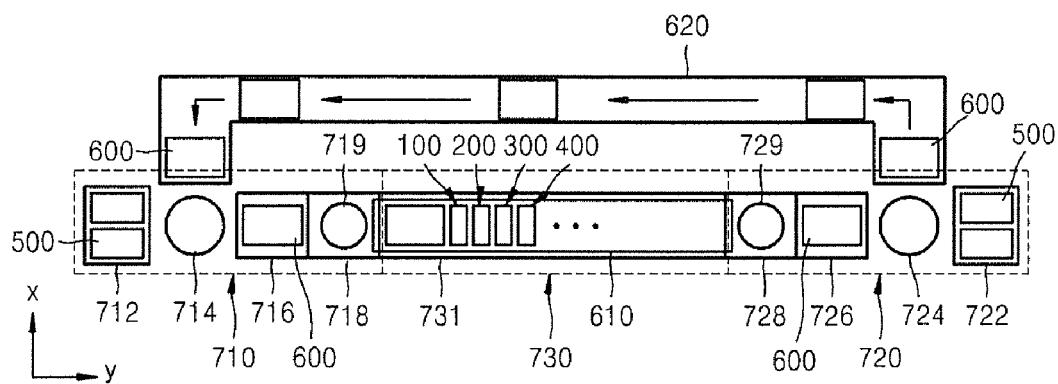
FIG. 1 is a schematic view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
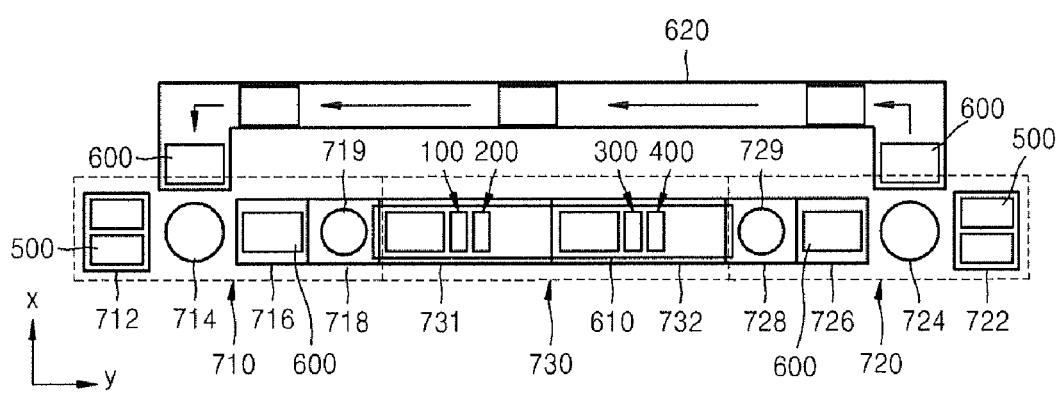
FIG. 2 is a schematic view of a thin film deposition apparatus according to another embodiment of the present invention.
Figure 3:
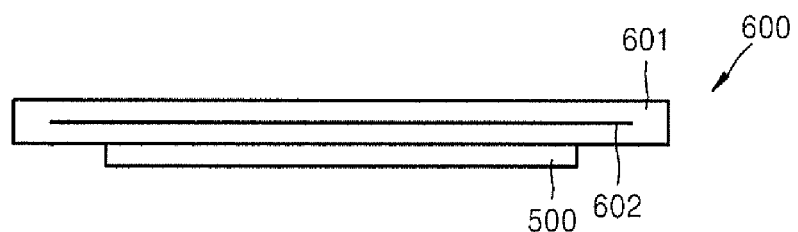
FIG. 3 is a schematic view of an electrostatic chuck included in the thin film deposition apparatus of FIG. 1 or 2, according to an embodiment of the present invention.

FIG. 1 is a schematic view of a thin film deposition apparatus according to another embodiment of the present invention. FIG. 2 is a schematic view of a thin film deposition apparatus 1 according to another embodiment of the present invention. FIG. 3 is a schematic view of an electrostatic chuck 600 included in the thin film deposition apparatus of FIG. 1 or 2, according to an embodiment of the present invention.

In particular and referring to FIG. 1, the thin film deposition apparatus according to the current embodiment includes a loading unit 710, an unloading unit 720, a deposition unit 730, a first circulating unit 610, and a second circulating unit 620.

The loading unit 710 may include a first rack 712, a transport robot 714, a transport chamber 716, and a first inversion chamber 718.

A plurality of substrates 500 onto which a deposition material has not yet been applied are stacked up on the first rack 712. The transport robot 714 picks up one of the substrates 500 from the first rack 712, disposes it on the electrostatic chuck 600 delivered by the second circulating unit 620, and moves the electrostatic chuck 600 on which the substrate 500 is disposed to the transport chamber 716. Although not shown in the drawings, the transport robot 714 may be disposed in a chamber that is maintained at an appropriate degree of vacuum.

The first inversion chamber 718 is disposed adjacent to the transport chamber 716. An inversion robot 719 located in the first inversion chamber 718 turns the electrostatic chuck 600 over to be disposed on the first circulating unit 610 on the deposition unit 730.

As illustrated in FIG. 3, in the electrostatic chuck 600, an electrode 602 to which voltage is applied is embedded into a body 601 formed of ceramic. When a high voltage is applied to the electrode 602, one of the substrates 500 is attached to the body 601. The electrostatic chuck 600 will be described in detail later.

Referring to FIG. 1, the transport robot 714 places one of the substrates 500 on the electrostatic chuck 600, the electrostatic chuck 600 on which the substrate 500 is disposed is moved to the transport chamber 716, and the first inversion robot 719 turns the electrostatic chuck 600 over so that the substrate 500 is turned upside down in the deposition unit 730. In more detail, the electrostatic chuck 600 is inverted so that the substrate 500 will face the thin film deposition assemblies 100, 200, 300, and 400 when the electrostatic chuck 600 and substrate pass through the deposition unit 730, to be described later. Both the transport chamber 716 and the first inversion chamber 718 may be chambers that are maintained at an appropriate degree of vacuum.

The operation of the unloading unit 720 is opposite to that of the loading unit 710. Specifically, a second inversion robot 729 moves the electrostatic chuck 600 on which the substrate 500 is disposed, which is moved from the deposition unit 730, to an ejection chamber 726 by turning the electrostatic chuck 600 over in a second inversion chamber 728. Then, an ejection robot 724 picks out the electrostatic chuck 600 on which the substrate 500 is disposed from the ejection chamber 726, separates the substrate 500 from the electrostatic chuck 600, and then places the substrate 500 on the second rack 722. The electrostatic chuck 600 that is separated from the substrate 500 is returned back to the loading unit 710 via the second circulating unit 620. Both the second inversion chamber 728 and the ejection chamber 726 may be chambers that are maintained at an appropriate degree of vacuum. Although not shown in the drawings, the ejection robot 724 may also be disposed in a chamber that is maintained at an appropriate degree of vacuum.

However, the present invention is not limited to the above description, and when the substrate 500 is initially disposed on the electrostatic chuck 600, the substrate 500 may be fixed onto a bottom surface of the electrostatic chuck 600 and may be moved to the deposition unit 730 together with the electrostatic chuck 600. (In FIGS. 1 and 2, terms such as "top surface" and "bottom surface" are with reference to a "top surface" being a surface facing the viewer in FIGS. 1 and 2 and "a bottom surface" as being a surface facing away from the viewer.) In this case, for example, the first and second inversion chambers 718 and 728 and the first and second inversion robots 719 and 729 are not needed.

The deposition unit 730 includes at least one deposition chamber. As illustrated in FIG. 1, the deposition unit 730 may include a first chamber 731, and first to fourth thin film deposition assemblies 100, 200, 300, and 400 may be disposed in the first chamber 731. Although FIG. 1 illustrates that a total of four thin film deposition assemblies, i.e., the first to fourth thin film deposition assemblies 100 to 400, are installed in the first chamber 731, the total number of thin film deposition assemblies that can be installed may vary according to a deposition material and deposition conditions. The first chamber 731 is maintained in a vacuum state during a deposition process.

In the thin film deposition apparatus illustrated in FIG. 2, a deposition unit 730 may include a first chamber 731 and a second chamber 732 that are connected to each other, and first and second thin film deposition assemblies 100 and 200 may be disposed in the first chamber 731 and third and fourth thin film deposition assemblies 300 and 400 may be disposed in the second chamber 732. In this case, other chambers may further be added.

In the embodiment illustrated in FIG. 1, the electrostatic chuck 600 on which the substrate 500 is disposed is either moved to the deposition unit 730 or is moved sequentially to the loading unit 710, the deposition unit 730, and the unloading unit 720 via the first circulating unit 610. The electrostatic chuck 600 that is separated from the substrate 500 in the unloading unit 720 is moved by the second circulating unit 620 to the loading unit 710.

The first circulating unit 610 is installed to more the electrostatic chuck on which the substrate 500 is disposed through the deposition chamber 731, and the second circulating unit 620 is installed to return the electrostatic chuck 600 that has been separated from the substrate back to a starting position at the loading unit 710.

Figure 4:
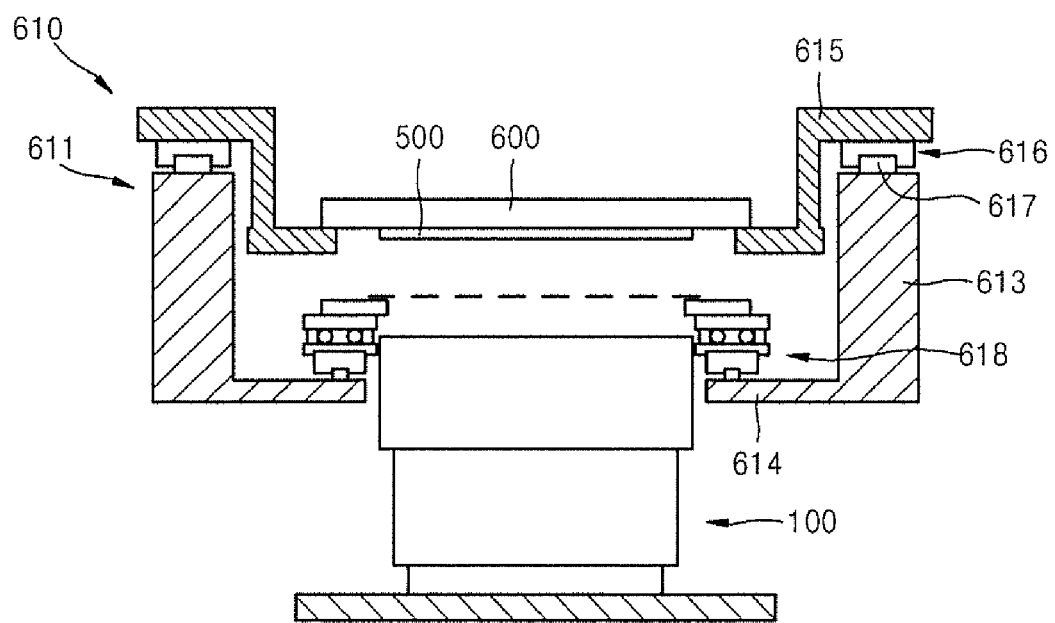
FIG. 4 is a cross-sectional view of a first circulating unit included in the thin film deposition apparatus of FIG. 1 or 2, according to an embodiment of the present invention.

FIG. 4 is a cross-sectional view of the first circulating unit 610 illustrated in FIG. 1 or 2, according to an embodiment of the present invention. Referring to FIG. 4, the first circulating unit 610 according to the present embodiment includes a first carrier 611 to move the electrostatic chuck 600 on which the substrate 500 is disposed.

The first carrier 611 includes a first support 613, a second support 614, a movement bar 615, and a first driving unit 616.

The first and second supports 613 and 614 are installed to extend through one or more chambers, e.g., the first chamber 731 in the deposition unit 730 in FIG. 1 and the first and second chambers 731 and 732 in the deposition unit 730 in FIG. 2.

The first support 613 is disposed vertically in the first chamber 731 and the second support 614 is disposed perpendicular to a lower part of the first support 613 in the first chamber 631. (In FIGS. 4 and 5, the term "vertically" refers to a direction between a thin film deposition assembly, such as thin film deposition assembly 100, and the substrate 500 and "horizontally" refers to a direction perpendicular to such vertical direction and perpendicular to a direction of motion of the substrate through the deposition unit 730. In more detail, the vertical direction and the horizontal direction in FIGS. 4 and 5 correspond to the Z direction and the X direction, respectively, as shown in FIGS. 8 to 16. In the current embodiment illustrated in FIG. 4, the first and second supports 613 and 614 are disposed perpendicular to each other, but the present invention is not limited thereto and they may be disposed in various ways provided the second support 614 is disposed below the first support 613.

The movement bars 615 are disposed respectively to move along upper sides of the first support 613. At least one end of each of the movement bars 615 is supported by the first support 613 and another end of each of the movement bar 614 supports the edge of the electrostatic chuck 600. The electrostatic chuck 600 may be moved along the first support 613 while being fixedly supported by the movement bars 615. The ends of the movement bars 615 which support the electrostatic chuck 600 may be bent toward the first thin film deposition assembly 100 so that the substrate 500 is located closer to the first thin film deposition assembly 100.

The first driving unit 616 is included between the first support 613 and each of the movement bars 615 and moves the movement bars 615 along the first support 613. The first driving unit 616 may include a plurality of rollers 617 to roll along ends of the first supports 613. In this regard, the first support 613 may be in the form of a rail extending in a direction perpendicular to the X and Z directions as described above, or in other words, in a direction perpendicular to the plane of the cross-sectional view of FIG. 5. The first driving unit 616 applies a driving force to the movement bars 615 to move along the first support 613. The driving force may either be generated by the first driving unit 616 or be supplied from a separate driving source (not shown). The type of the first driving unit 616 is not limited provided the first driving unit 616 can move the rollers 617 and the movement bars 615.

Figure 5:
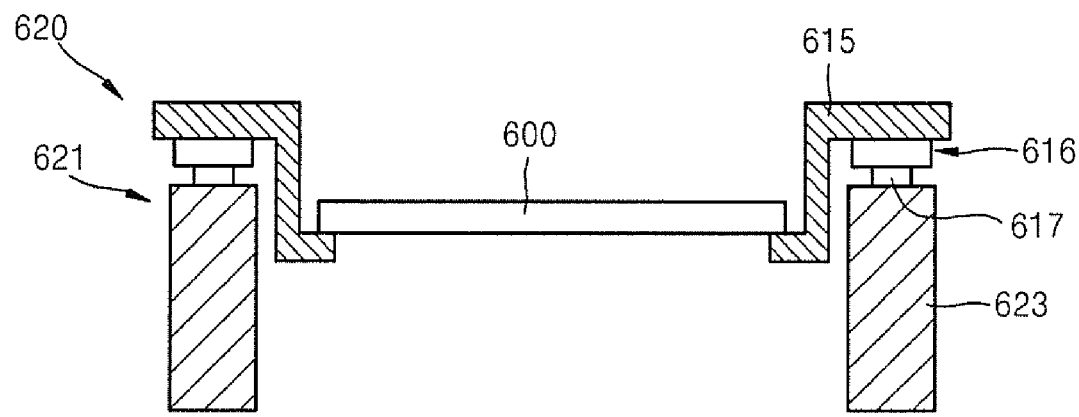
FIG. 5 is a cross-sectional view of a second circulating unit included in the thin film deposition apparatus of FIG. 1 or 2, according to an embodiment of the present invention.

FIG. 5 is a cross-sectional view of the second circulating unit 620 of FIG. 1 or 2, according to an embodiment of the present invention. Referring to FIG. 5, the second circulating unit 610 according to the present embodiment includes a second carrier 621 to return the electrostatic chuck 600 from which the substrate 500 of FIG. 1 or 2 has been separated to a starting position adjacent the loading unit 710.

The second carrier 621 includes a third support 623, a movement bar 615, and a plurality of first driving units 616.

The third support 623 extends in a similar manner to the first support 613 of the first carrier 611. The third support 623 supports the movement bars 615 each having the first driving unit 616, and the electrostatic chuck 600 from which the substrate 500 has been separated is placed on the movement bars 615. The constructions of the movement bars 615 and the first driving units 616 are as described above with reference to FIG. 4.

When the electrostatic chuck 600 is moved by the first and second carriers 611 and 621, power should be supplied continuously to the electrostatic chuck 600 even during movement. A system that supplies power to the electrostatic chuck 600 during movement will now be described in detail.

Figure 6:
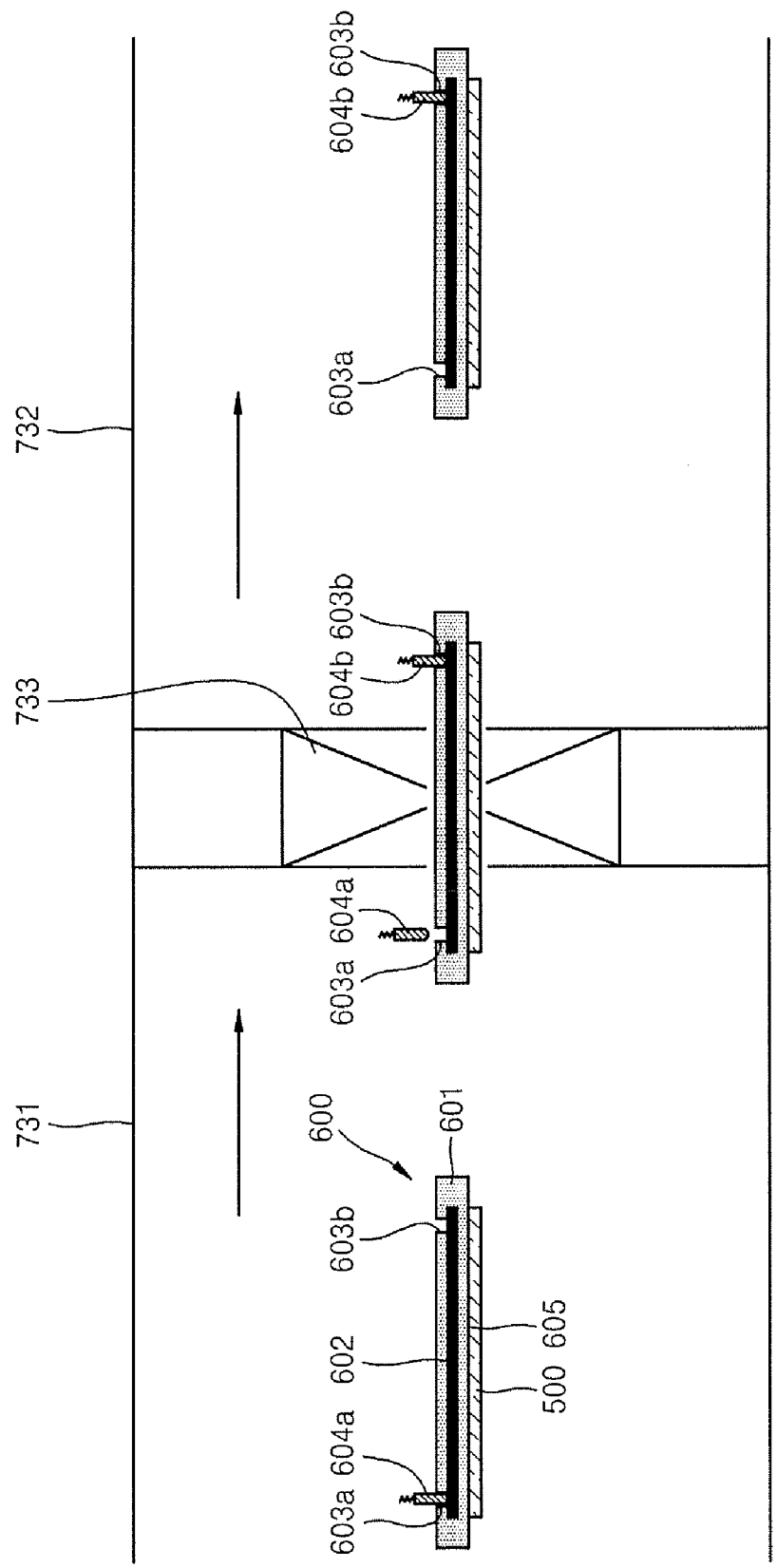
FIG. 6 is a cross-sectional view of a system that supplies power to the electrostatic chuck during movement, according to an embodiment of the present invention.

FIG. 6 is a cross-sectional view of a system that supplies power to the electrostatic chuck 600 during movement, according to an embodiment of the present invention. The electrostatic chuck 600 includes a body 601 having a supporting surface 605 that contacts the substrate 500 to support a flat larger surface of the substrate 500. The electrode 602 is embedded into the body 601 in order to apply an electrostatic force to the supporting surface 605. Also, in the body 601, a plurality of power source holes are formed to expose the electrode 602. Referring to FIG. 6, first and second power source holes 603a and 603b are formed at different locations. The first and second power source holes 603a and 603b may be disposed apart from each other.

Referring to FIG. 6, the first and second power source holes 603a and 603b may be respectively located at the tail and head of the body 610, with respect to a movement direction in which the electrostatic chuck is moved, as indicated by the arrows in FIG. 6.

In the current embodiment illustrated in FIG. 6, the electrostatic chuck 600 is continuously powered on during movement by using a power source plug 604a and a second power source plug 604b that are respectively installed in the first and second chambers 731 and 732 which are also illustrated in FIG. 2. Accordingly, the electrostatic chuck 600 may be powered on even if it is moved between adjacent chambers.

The first power source plug 604a is installed at location upstream in the path marked by the arrow. In the current embodiment illustrated in FIG. 6, the first power source plug 604a is disposed in the first chamber 731. The first power source plug 604a may be installed to be attachable to and detachable from the first power source hole 603a or the second power source hole 603b. In the current embodiment illustrated in FIG. 6, the first power source plug 604a is inserted into the first power source hole 603a but the present invention is not limited thereto. Alternatively, the first power source plug 604a installed at an upstream location in the path may be inserted into the second power source hole 603b located at a downstream portion of the body 610 moving along the path.

The second power source plug 604b is installed at a downstream location in the path. The second power source plug 604b is illustrated as being located in the second chamber 732 in the embodiment illustrated in FIG. 6. The second power source plug 604b may be installed to be attachable to and detachable from the first power source hole 603a or the second power source hole 603b. In the current embodiment illustrated in FIG. 6, the second power source plug 604b is inserted into the second power source hole 603b but the present invention is not limited thereto. Alternatively, the second power source plug 604b installed at the downstream of the path may be inserted into the first power source hole 603a located at the tail of the electrostatic chuck 600.

The first and second power source plugs 604a and 604b may be respectively installed to be movable within the first and second chambers 731 and 732. Accordingly, the first power source plug 604a is inserted into the first power source hole 603a to supply power to the electrode 602 while the electrostatic chuck 600 is located within the first chamber 731, and the second power source plug 604b is inserted into the second power source hole 603b to supply power to the electrode 602 while the electrostatic chuck 600 is located within the second chamber 732. A chamber door 733 is installed between the first and second chambers 731 and 732. When the electrostatic chuck 600 passes through the chamber door 733, the first power source plug 604a is separated from the first power source hole 603a at the moment or after the second power source plug 604b is inserted into the second power source hole 603b as illustrated in FIG. 6, thereby preventing an interruption in supply of power to the electrode 602.

In the current embodiment illustrated in FIG. 6, the first and second power source plugs 604a and 604b are respectively installed in the first and second chambers 731 and 732 but the present invention is not limited thereto and the first and second power source plugs 604a and 604b may be installed at different locations in the first chamber 731 illustrated in FIG. 1. In this case, when the electrostatic chuck 600 passes through the chamber door 733, the first power source plug 604a should also be separated from the first power source hole 603a at the moment or after the second power source plug 604b is inserted into the second power source hole 603b as illustrated in FIG. 6, thereby preventing an interruption in supply of power to the electrode 602.

Alternatively, the first and second power source holes 603a and 603b may be located in a position other than the tail and head of the body 601 of the electrostatic chuck 600, provided that the first and second power source holes 603a and 603b are located apart from each other. In this case, when the electrostatic chuck 600 passes through the chamber door 733, the first power source plug 604a should also be separated from the first power source hole 603a at the moment or after the second power source plug 604b is inserted into the second power source hole 603b as illustrated in FIG. 6, thereby preventing an interruption in supply of power to the electrode 602.

Figure 7:
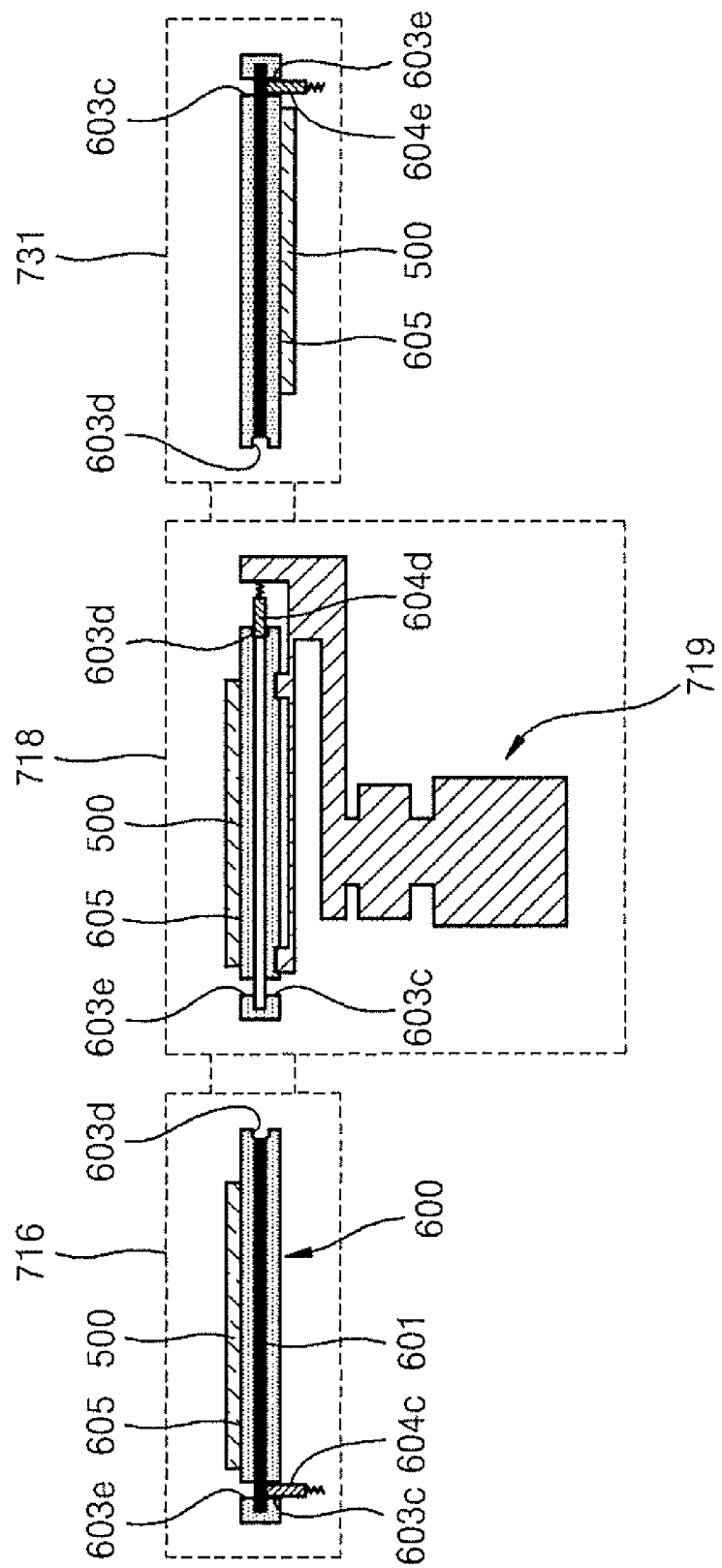
FIG. 7 is a cross-sectional view of a system that supplies power to the electrostatic chuck during movement, according to another embodiment of the present invention.

FIG. 7 is a cross-sectional view of a system that supplies power to the electrostatic chuck 600 during movement, according to another embodiment of the present invention. In the current embodiment, the electrostatic chuck 600 is moved from the transport chamber 716 to the first inversion chamber 718 and finally, to the first chamber 731.

Referring to FIG. 7, a third power source hole 603c, a fourth power source hole 603d, and a fifth power source hole 603e are formed at different locations on a body 601 of the electrostatic chuck 600. A third power source plug 604c, a fourth power source plug 604d, and a fifth power source plug 604e are installed in the first transport chamber 716, the first inversion chamber 718, and the first chamber 731, respectively. The fourth power source plug 604d is installed in the first inversion robot 719.

The electrostatic chuck 600 is moved while the third power source plug 604c is inserted into the third power source hole 603c in the transport chamber 716. Even after the electrostatic chuck 600 is partially or completely moved from the transport chamber 716 to the first inversion chamber 718, the third power source plug 604c is maintained in the third power source hole 603c, thereby continuously supplying power to the electrode 602. In the first inversion chamber 718, the third power source plug 604c is separated from the third power source hole 603c at the moment or after the fourth power source plug 604d installed in the first inversion robot 719 is inserted into the fourth power source hole 603d. The first inversion robot 719 turns the electrostatic chuck 600 over in the first inversion chamber 718 so that the substrate 500 placed on the electrostatic chuck 600 is turned upside down, and the electrostatic chuck 600 enters into the first chamber 731. Then, the fourth power source plug 604d is separated from the fourth power source hole 603d at the moment or after the fifth power source plug 604e is inserted into the fifth power source hole 603e in the first chamber 731.

Accordingly, in the current embodiment, the electrostatic chuck 600 can be powered continuously even while the electrostatic chuck 600 is moved by a carrier.

Next, the first thin film deposition assembly 100 disposed in the first chamber 731 will be described.

Figure 8:
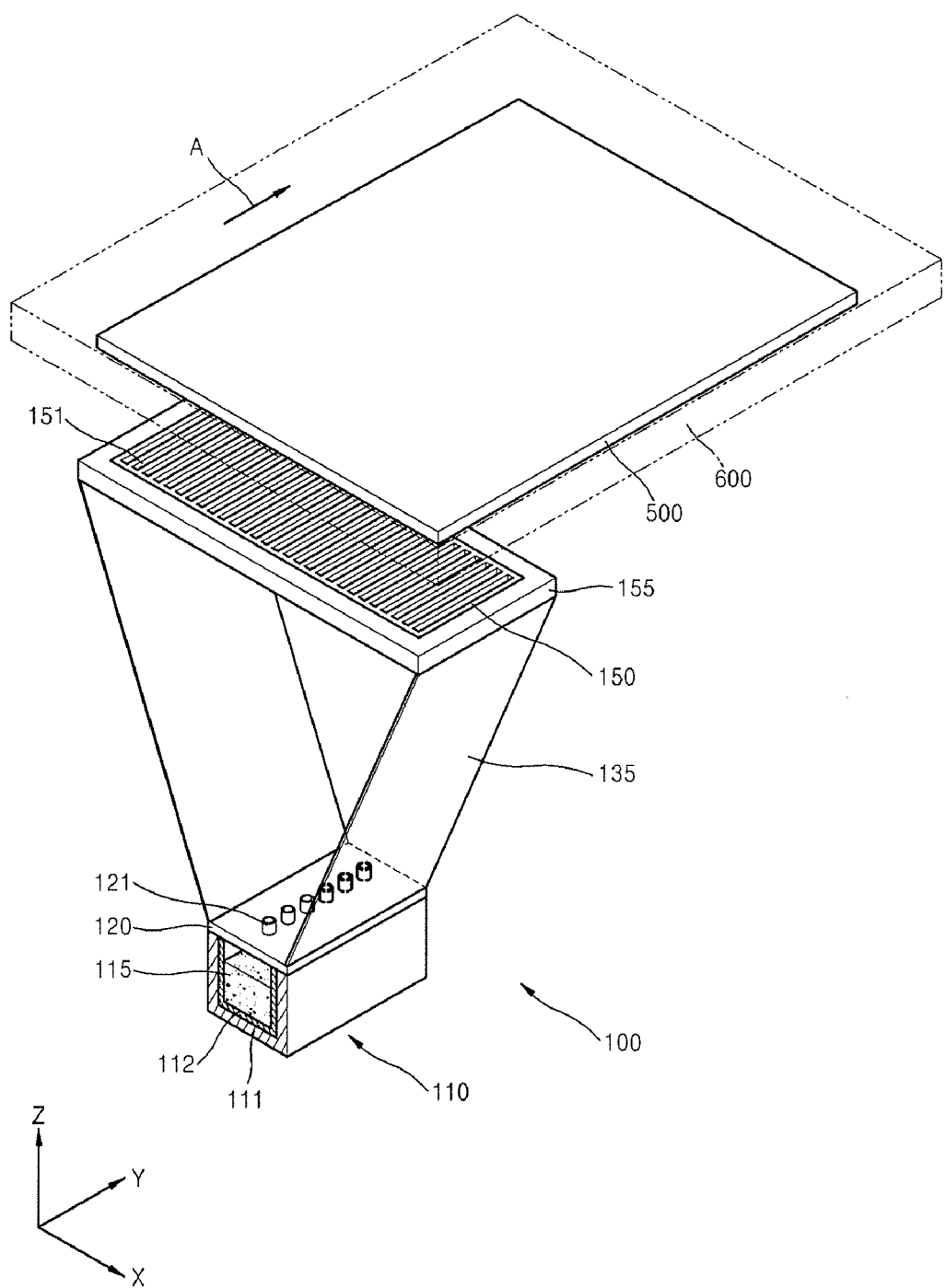
FIG. 8 is a schematic perspective view of a thin film deposition assembly according to an embodiment of the present invention.
Figure 9:
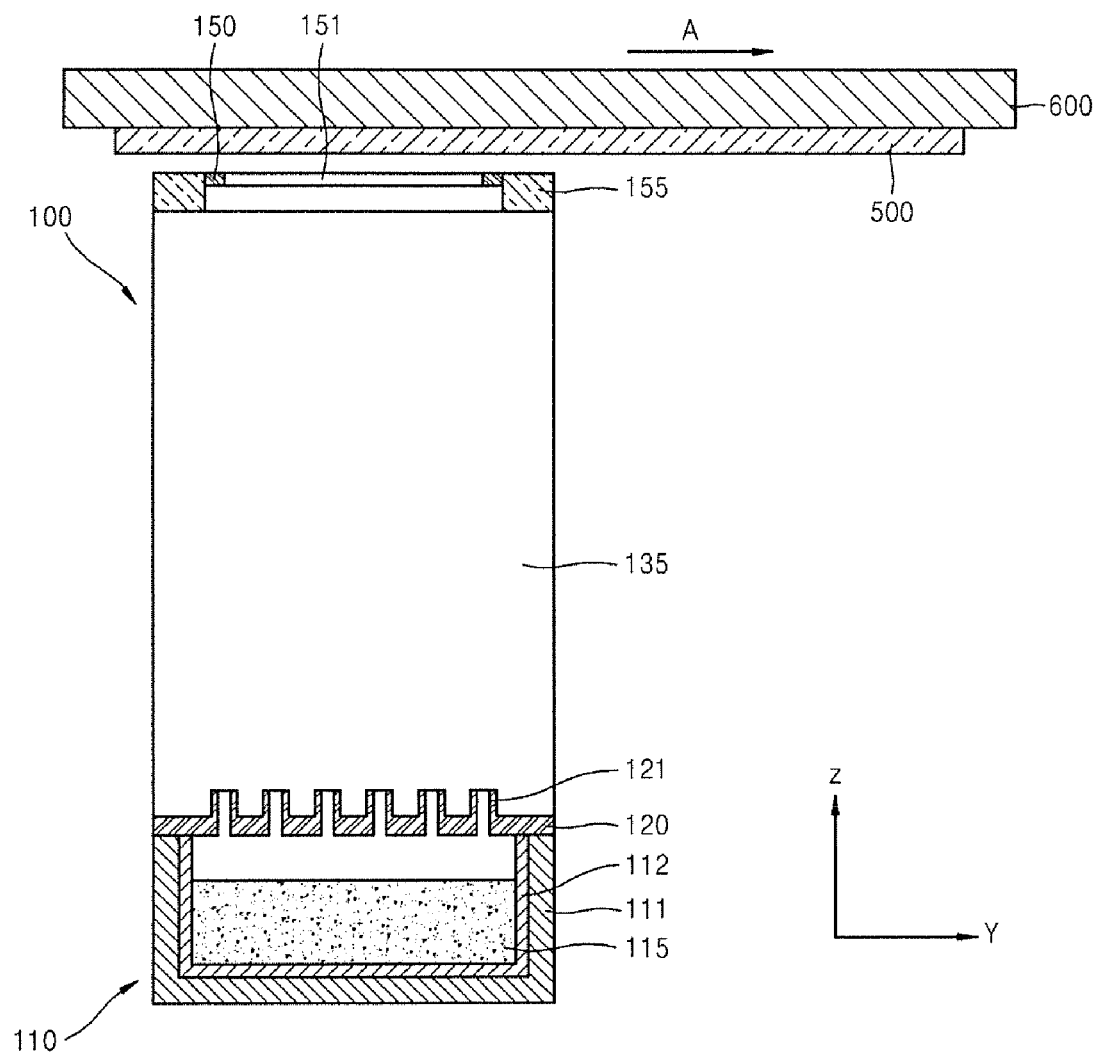
FIG. 9 is a schematic sectional side view of the thin film deposition assembly of FIG. 8.
Figure 10:
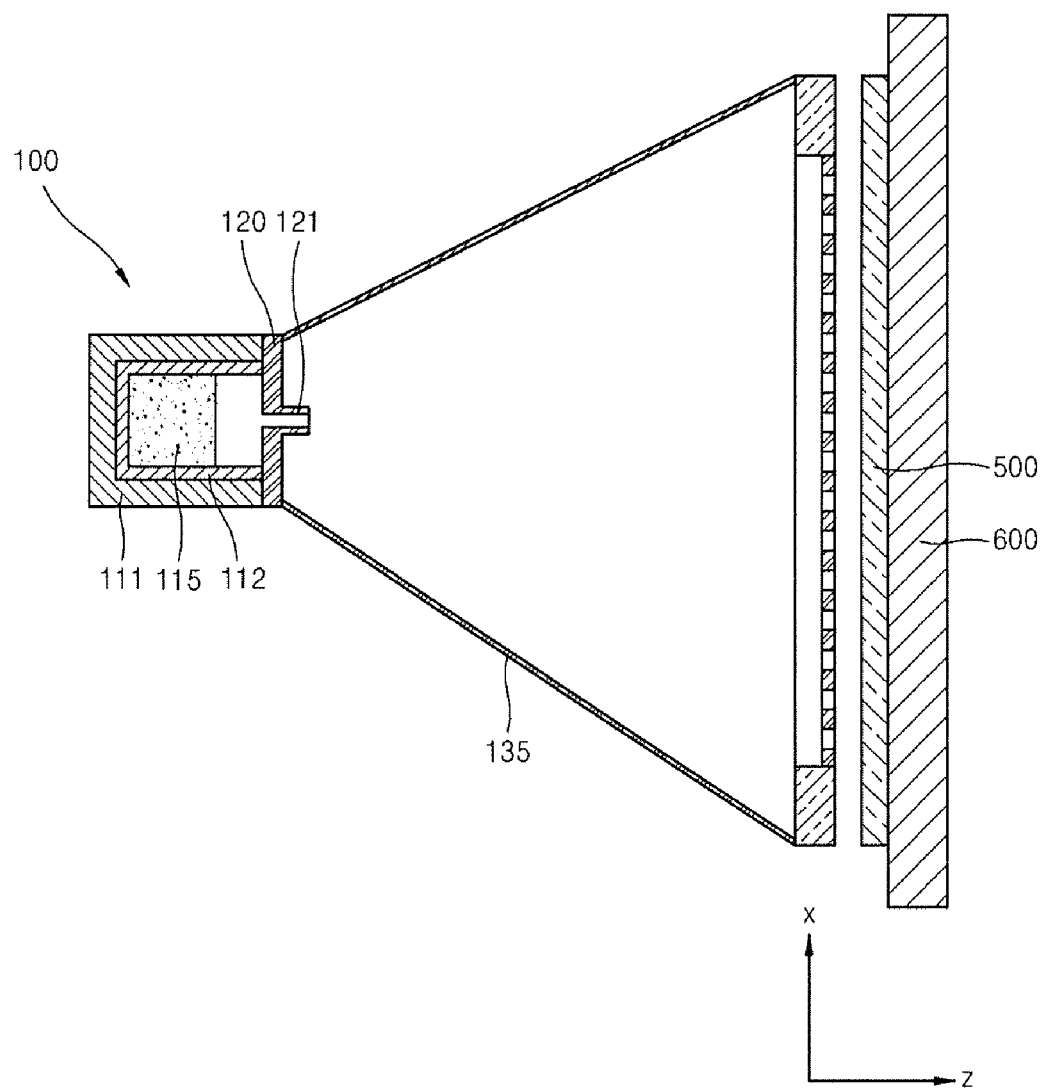
FIG. 10 is a schematic sectional plan view of the thin film deposition assembly of FIG. 8.

FIG. 8 is a schematic perspective view of a thin film deposition assembly 100 according to an embodiment of the present invention. FIG. 9 is a schematic sectional side view of the thin film deposition assembly 100 of FIG. 8. FIG. 10 is a schematic sectional plan view of the thin film deposition assembly 100 of FIG. 8.

Referring to FIGS. 8 to 10, the thin film deposition assembly 100 includes a deposition source 110, a deposition source nozzle unit 120, and a patterning slit sheet 150.

Specifically, it is desirable to maintain the first chamber 731 of FIG. 1 in a high-vacuum state as in a deposition method using a fine metal mask (FMM) so that a deposition material 115 emitted from the deposition source 110 may be deposited onto a substrate 400 in a desired pattern via the deposition source nozzle unit 120 and the patterning slit sheet 150. In addition, the temperature of the patterning slit sheet 150 should be sufficiently lower than that of the deposition source 110. In this regard, the temperature of the patterning slit sheet 150 may be about 100° C. or less. The temperature of the patterning slit sheet 150 should be sufficiently low so as to minimize thermal expansion of the patterning slit sheet 150.

The substrate 500, which is a deposition target, is disposed in the first chamber 731. The substrate 500 may be a substrate for flat panel displays. A large substrate, such as a mother glass, for manufacturing a plurality of flat panel displays, may be used as the substrate 500. Other substrates may also be employed. The substrate is affixed to the electrostatic chuck 600 as describe above.

In the current embodiment, deposition may be performed while the substrate 500 or the thin film deposition assembly 100 is moved relative to the other. Herein, where it is stated that the substrate or thin film deposition assembly is moved relative to the other, it is to be understood that such statement encompasses an embodiment in which only the substrate is moved and the thin film deposition assembly remains stationary, an embodiment in which only the thin film deposition assembly is moved and the substrate remains stationary and an embodiment in which both the thin film deposition assembly and the substrate are moved.

In particular, in the conventional FMM deposition method, the size of the FMM should be equal to the size of a substrate. Thus, the size of the FMM has to be increased when larger substrates are used. However, it is difficult to manufacture a large FMM and to extend an FMM to be accurately aligned with a pattern.

In order to overcome this problem, in the thin film deposition assembly 100 according to the current embodiment, deposition may be performed while the thin film deposition assembly 100 or the substrate 500 is moved relative to each other. In more detail, deposition may be continuously performed while the substrate 500, which is disposed such as to face the thin film deposition assembly 100, is moved in a Y-axis direction. That is, deposition is performed in a scanning manner while the substrate 500 is moved in a direction of arrow A in FIG. 8.

In the thin film deposition assembly 100 according to the current embodiment, the patterning slit sheet 150 may be significantly smaller than an FMM used in a conventional deposition method. That is, in the thin film deposition assembly 100 according to the current embodiment, deposition is continuously performed, i.e., in a scanning manner while the substrate 500 is moved in the Y-axis direction. Thus, the lengths of the patterning slit sheet 950 in the X-axis and Y-axis directions may be significantly less than the lengths of the substrate 500 in the X-axis and Y-axis directions. As described above, since the patterning slit sheet 150 may be formed to be significantly smaller than an FMM used in a conventional deposition method, it is relatively easy to manufacture the patterning slit sheet 150. That is, using the patterning slit sheet 150, which is smaller than an FMM used in a conventional deposition method, is more convenient in all processes, including etching and other subsequent processes, such as precise extension, welding, moving, and cleaning processes, than using the larger FMM. This is more advantageous for a relatively large display device.

The deposition source 110 that contains and heats the deposition material 115 is disposed in an opposite side of the thin film deposition assembly 100 from a side in which the substrate 500 is disposed. The deposition material 115 that is vaporized in the deposition source 110 is deposited onto the substrate 500.

In particular, the deposition source 110 includes a crucible 112 that is filled with the deposition material 115, and a heater (not shown) that heats the crucible 112 to vaporize the deposition material 115, which is contained in the crucible 112, such that the deposition material 115 is directed towards the deposition source nozzle unit 120. The cooling block 111 prevents heat generated from the crucible 112 from being conducted to the outside, i.e., the first chamber 731. The heater may be incorporated in the cooling block 111.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 in the Y-axis direction, i.e., a scanning direction of the substrate 500. The plurality of deposition source nozzles 121 may be arranged at equal intervals. The deposition material 115 that is vaporized in the deposition source 110, passes through the deposition source nozzle unit 120 towards the substrate 500. As described above, when the deposition source nozzle unit 120 includes the plurality of deposition source nozzles 121 arranged in the Y-axis direction, that is, the scanning direction of the substrate 500, the size of a pattern formed of the deposition material 115 discharged through a plurality of patterning slits 151 of the patterning slit sheet 150 is affected by the size of each of the deposition source nozzles 121 (since there is only one line of deposition nozzles in the X-axis direction), thereby preventing a shadow zone from being formed on the substrate 500. In addition, since the plurality of deposition source nozzles 121 are arranged in the scanning direction of the substrate 500, even there is a difference in flux between the deposition source nozzles 121, the difference may be compensated for and deposition uniformity may be maintained constantly.

The patterning slit sheet 150 and a frame 155 are disposed between the deposition source 110 and the substrate 500. The frame 155 may be formed in a shape similar to a window frame. The patterning slit sheet 150 is bound inside the frame 155. The patterning slit sheet 150 includes the plurality of patterning slits 151 arranged in the X-axis direction. The deposition material 115 that is vaporized in the deposition source 110, passes through the deposition source nozzle unit 120 and the patterning slit sheet 150 towards the substrate 500. The patterning slit sheet 150 may be manufactured by etching, which is the same method as used in a conventional method of manufacturing an FMM, and in particular, a striped FMM. In this regard, the total number of the patterning slits 151 may be greater than the total number of the deposition source nozzles 121.

In addition, the deposition source 110 (and the deposition source nozzle unit 120 coupled to the deposition source 110) may be disposed to be spaced apart from the patterning slit sheet 150 by a predetermined distance. The deposition source 110 (and the deposition source nozzle unit 120 coupled to the deposition source 110) may be connected to the patterning slit sheet 150 by connection members 135. That is, the deposition source 110, the deposition source nozzle unit 120, and the patterning slit sheet 150 may be integrally formed as one body by being connected to one another via the connection members 135. The connection members 135 may guide the deposition material 151, which is discharged through the deposition source nozzles 121, to move straight and not to deviate in the X-axis direction.

Referring to FIG. 8, the connection members 135 are formed on left and right sides of the deposition source 110, the deposition source nozzle unit 120, and the patterning slit sheet 150 to guide the deposition material 915 not to deviate in the X-axis direction; however, aspects of the present invention are not limited thereto. For example, the connection member 135 may be formed in the form of a sealed box to guide flow of the deposition material 915 both in the X-axis and Y-axis directions.

As described above, the thin film deposition assembly 100 according to the current embodiment performs deposition while being moved relative to the substrate 500. In order to move the thin film deposition assembly 100 relative to the substrate 500, the patterning slit sheet 150 is spaced apart from the substrate 500 by a predetermined distance.

More specifically, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger but it is not easy to manufacture such a large mask.

In order to overcome this problem, in the thin film deposition assembly 100 according to the current embodiment, the patterning slit sheet 150 is disposed to be spaced apart from the substrate 500 by a predetermined distance.

As described above, according to aspects of the present invention, a mask may be formed to be smaller than a substrate, and deposition may be performed while the mask is moved relative to the substrate. Thus, the mask can be easily manufactured. In addition, it is possible to prevent occurrence of defects caused by the contact between the substrate and the mask. Furthermore, since it is unnecessary to use the mask in close contact with the substrate during a deposition process, the manufacturing time may be reduced.

Figure 11:
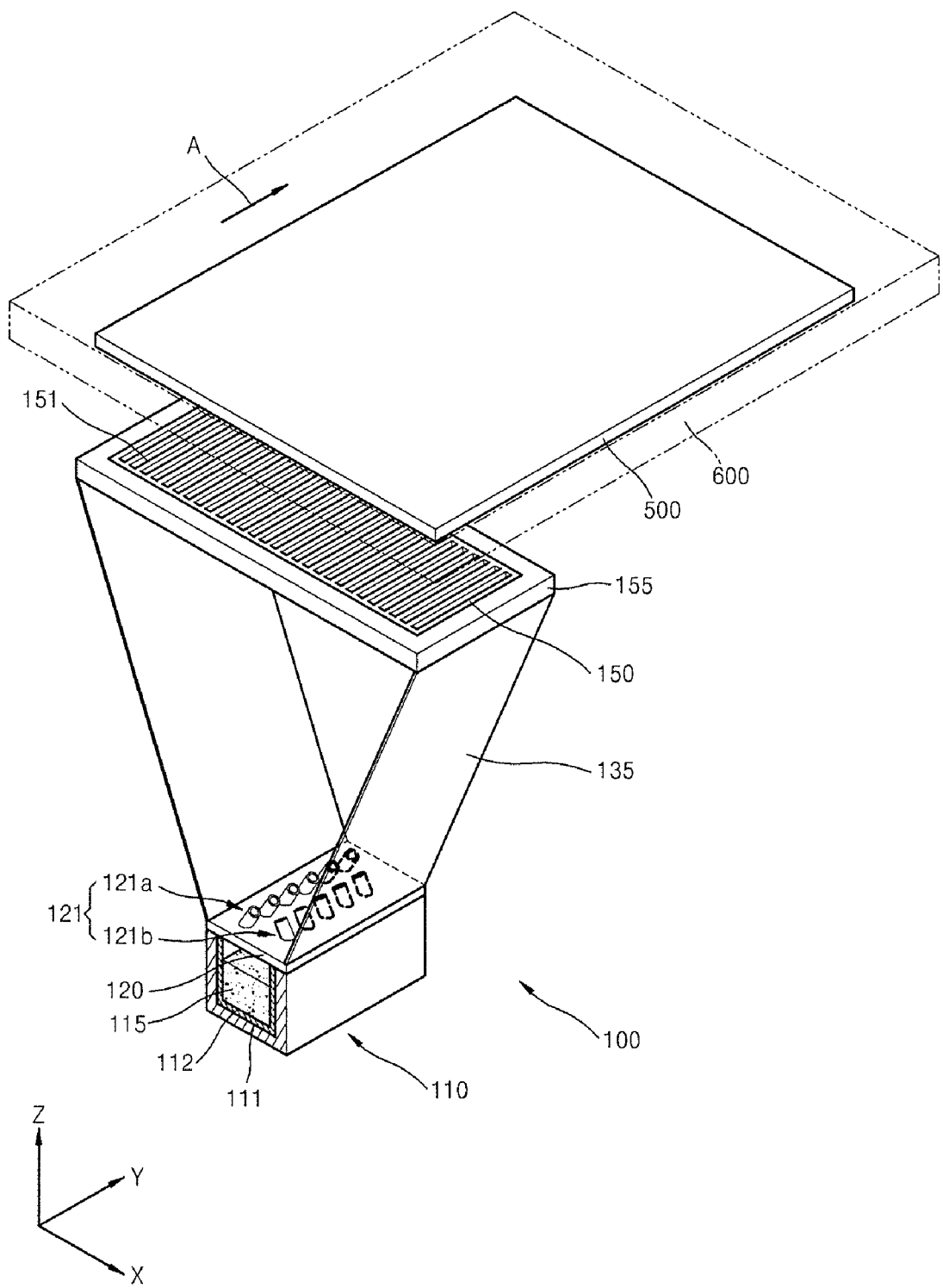
FIG. 11 is a schematic perspective view of a thin film deposition assembly according to another embodiment of the present invention.

FIG. 11 is a schematic perspective view of a thin film deposition assembly 100 according to another embodiment of the present invention. Referring to FIG. 10, the thin film deposition assembly 100 according to the current embodiment includes a deposition source 110, a deposition source nozzle unit 120, and a patterning slit sheet 150. The deposition source 110 includes a crucible 112 that is filled with a deposition material 115, and a cooling block 111 including a heater that heats the crucible 112 to vaporize the deposition material 115 that is contained in the crucible 112, so as to move the vaporized deposition material 115 to the deposition source nozzle unit 120. The deposition source nozzle unit 120, which has a planar shape, is disposed at a side of the deposition source 110, and includes a plurality of deposition source nozzles 121 arranged in the Y-axis direction. The patterning slit sheet 150 and a frame 155 are further disposed between the deposition source 110 and a substrate 500. The patterning slit sheet 150 includes a plurality of patterning slits 151 arranged in the X-axis direction. In addition, the deposition source 110 and the deposition source nozzle unit 120 may be connected to the patterning slit sheet 150 by first connection members 135.

In the current embodiment, the plurality of deposition source nozzles 121 formed on the deposition source nozzle unit 120 are tilted at a predetermined angle, unlike the embodiment described with reference to FIG. 8. In particular, the deposition source nozzles 121 may include deposition source nozzles 121a and 121b arranged in respective rows. The deposition source nozzles 121a and 121b may be arranged in respective rows to alternate in a zigzag pattern. The deposition source nozzles 121a and 121b may be tilted at a predetermined angle on an X-Z plane.

In the current embodiment of the present invention, the deposition source nozzles 121a and 121b are arranged to tilt at a predetermined angle toward each other. The deposition source nozzles 121a in a first row and the deposition source nozzles 121b in a second row may tilt at the predetermined angle to face each other. In other words, the deposition source nozzles 121a of the first row in a left part of the deposition source nozzle unit 121 may tilt to face a right side portion of the patterning slit sheet 150, and the deposition source nozzles 121b of the second row in a right part of the deposition source nozzle unit 121 may tilt to face a left side portion of the patterning slit sheet 150.

Owing to the structure of the thin film deposition assembly 100 according to the current embodiment, the deposition of the deposition material 115 may be adjusted to lessen a thickness variation between the center and end portions of the substrate 500, thereby improving thickness uniformity of a deposition film. Moreover, utilization efficiency of the deposition material 115 may also be improved.

Figure 12:
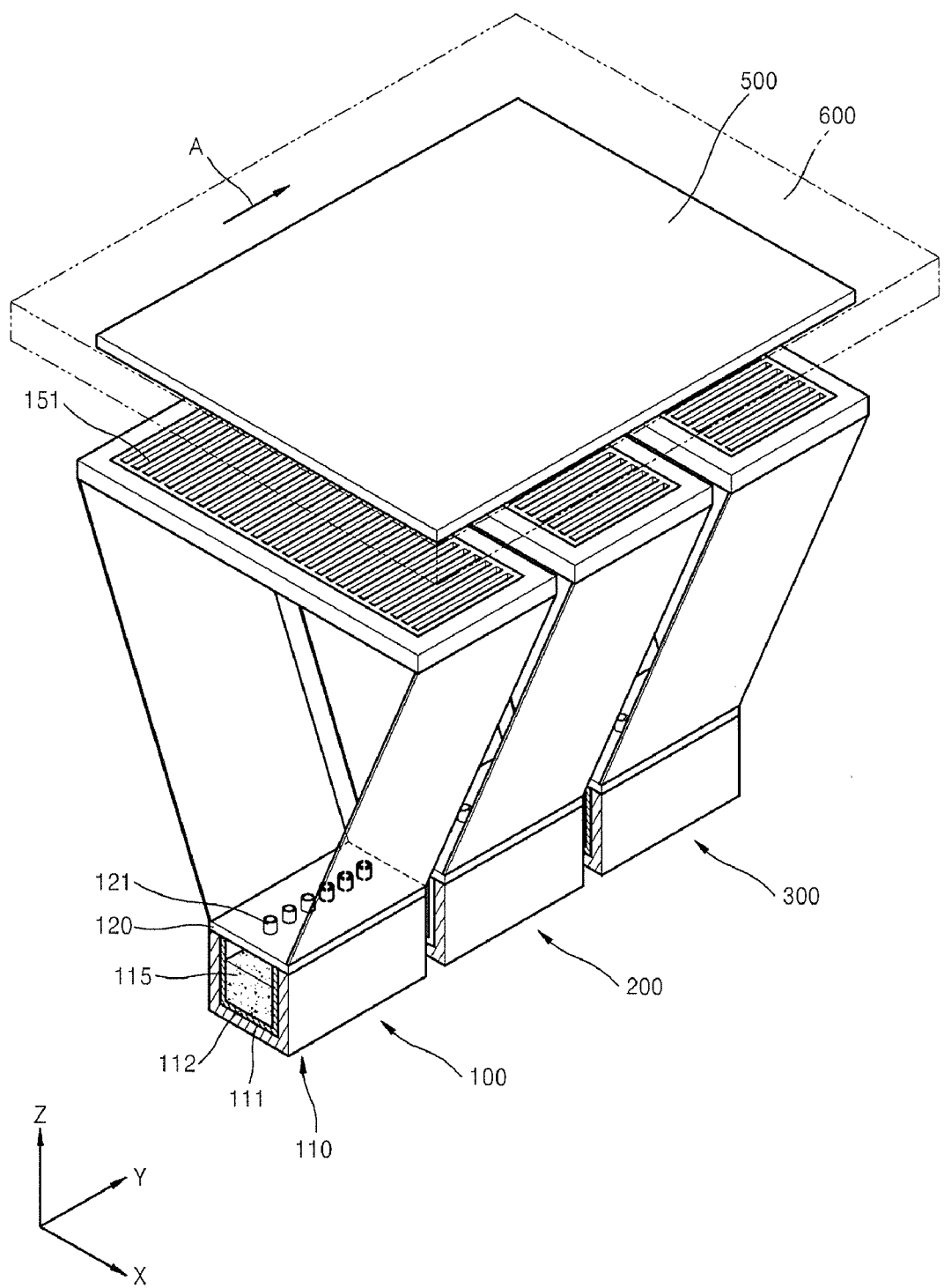
FIG. 12 is a schematic perspective view of a thin film deposition assembly according to another embodiment of the present invention.
Figure 13:
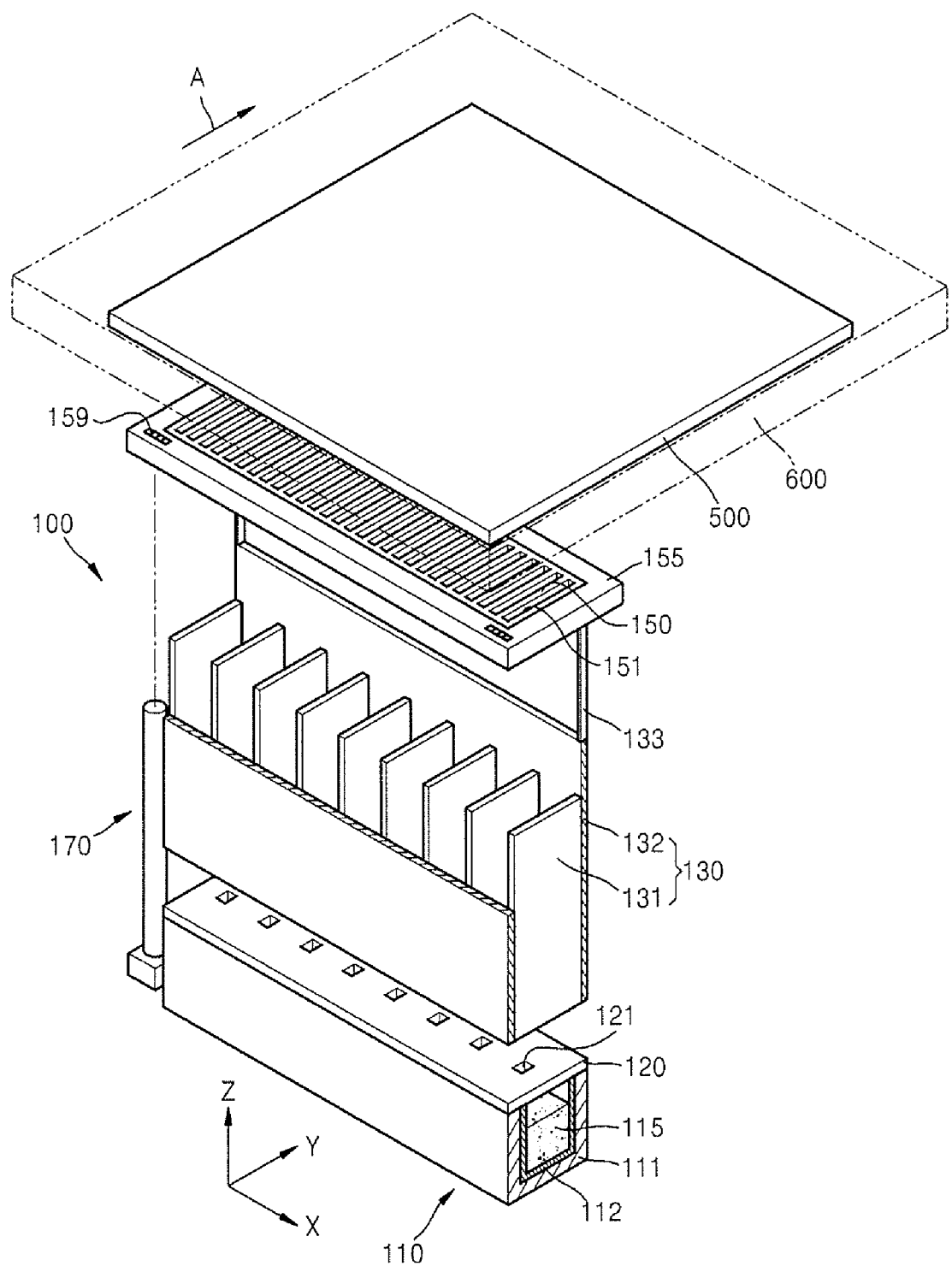
FIG. 13 is a schematic perspective view of a thin film deposition assembly according to another embodiment of the present invention.

FIG. 12 is a schematic perspective view of a thin film deposition apparatus according to another embodiment of the present invention. Referring to FIG. 13, the thin film deposition apparatus according to the current embodiment includes a plurality of thin film deposition assemblies, each of which has the structure of the thin film deposition apparatus 100 illustrated in FIGS. 8 through 10. In other words, the thin film deposition apparatus according to the current embodiment may include a multi-deposition source that simultaneously discharges deposition materials for forming a red ("R") emission layer, a green ("G") emission layer, and a blue ("B") emission layer.

In particular, the thin film deposition apparatus according to the current embodiment includes a first thin film deposition assembly 100, a second thin film deposition assembly 200, and a third thin film deposition assembly 300. The first thin film deposition assembly 100, the second thin film deposition assembly 200, and the third thin film deposition assembly 300 have the same structure as the thin film deposition assembly 100 described with reference to FIGS. 8 through 10, and thus a detailed description thereof will not be repeated here.

Deposition sources of the first, second and third thin film deposition assemblies 100, 200 and 300 may contain different deposition materials, respectively. For example, the first thin film deposition assembly 100 may contain a deposition material for forming the R emission layer, the second thin film deposition assembly 200 may contain a deposition material for forming the G emission layer, and the third thin film deposition assembly 300 may contain a deposition material for forming the B emission layer.

In a conventional method of manufacturing an organic light-emitting display device, a separate chamber and mask are used to form each color emission layer. However, when the thin film deposition apparatus according to the current embodiment is used, the R emission layer, the G emission layer and the B emission layer may be formed at the same time with a single multi-deposition source. Thus, it is possible to sharply reduce a time needed to manufacture an organic light-emitting display device. Furthermore, the organic light-emitting display device may be manufactured with fewer chambers, so that equipment costs are also markedly reduced. In particular, thin film deposition assemblies 100, 200, 300 may be located in a single deposition chamber 731 as shown in FIG. 1 or in separate deposition chambers 731 and 732 housed in a single deposition unit 730 as shown in FIG. 2 through which a circulating unit 610 conveys an electrostatic chuck 600 to which a substrate 500 is affixed.

Although not illustrated, patterning slit sheets of the first, second, and third thin film deposition assemblies 100, 200, and 300 may be arranged to be offset by a predetermined distance with respect to each other, so that deposition regions corresponding to the patterning slit sheets do not to overlap with one another on a substrate 500. In other words, if the first thin film deposition assembly 100, the second thin film deposition assembly 200, and the third thin film deposition assembly 200 are used to deposit the R emission layer, the G emission layer and the B emission layer, respectively, then patterning slits of the first, second, and third thin film deposition assemblies 100, 200, and 300 are arranged not to be aligned with respect to each other, in order to form the R emission layer, the G emission layer and the B emission layer in different regions of the substrate 500.

In addition, the deposition materials for forming the R emission layer, the G emission layer, and the B emission layer may be vaporized at different temperatures. Therefore, the temperatures of the deposition sources of the respective first, second, and third thin film deposition assemblies 100, 200, and 300 may be set to be different.

Although the thin film deposition apparatus according to the current embodiment includes three thin film deposition assemblies, the present invention is not limited thereto. That is, a thin film deposition apparatus according to another embodiment of the present invention may include a plurality of thin film deposition assemblies, each of which contains a different deposition material. For example, a thin film deposition apparatus according to another embodiment of the present invention may include five thin film deposition assemblies respectively containing materials for an R emission layer, a G emission layer, a B emission layer, an auxiliary layer R' of the R emission layer, and an auxiliary layer G' of the G emission layer.

As described above, a plurality of thin films may be formed at the same time with a plurality of thin film deposition assemblies, and thus manufacturing yield and deposition efficiency are improved. In addition, the overall manufacturing process is simplified and the manufacturing costs are reduced.

Figure 14:
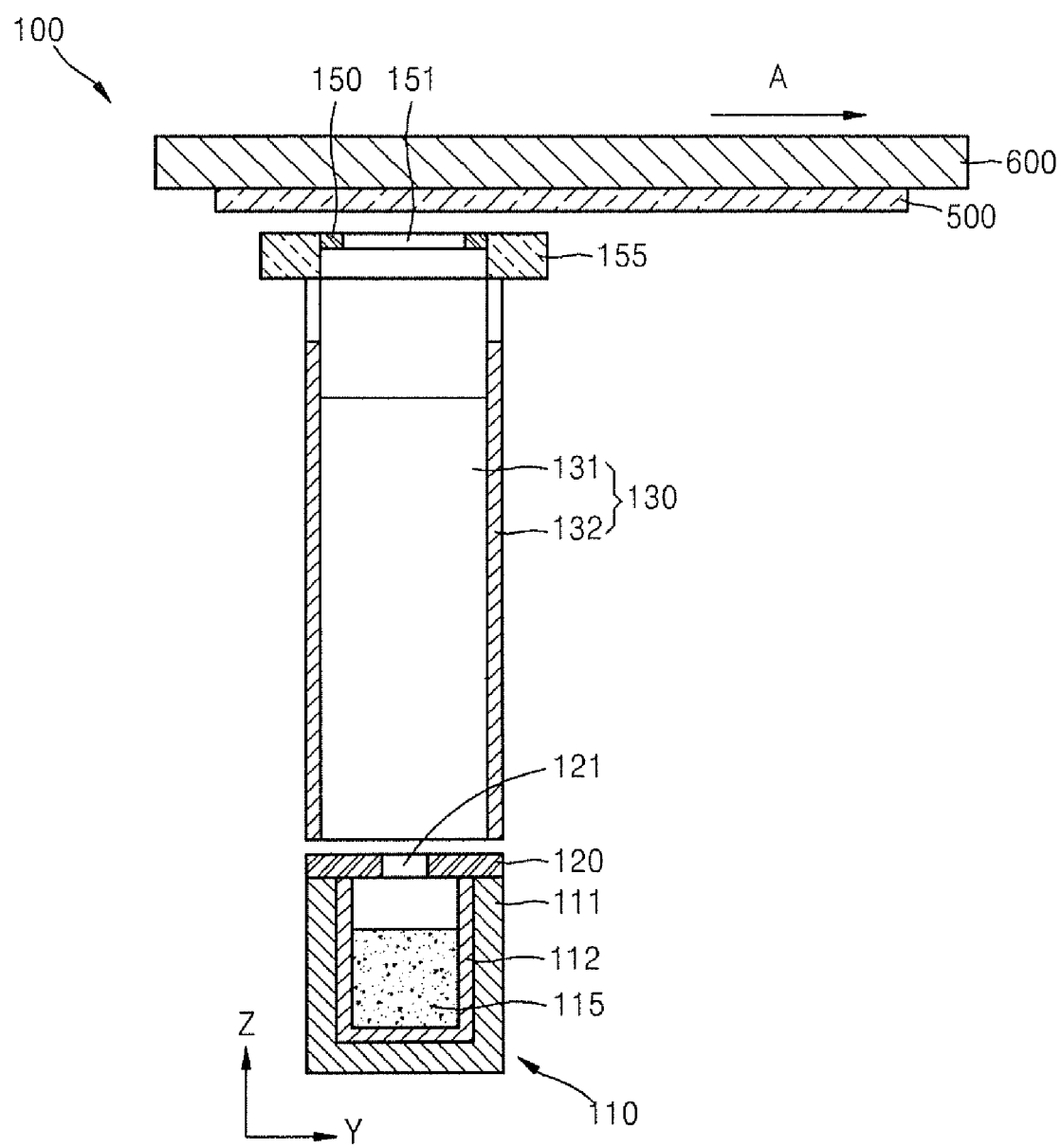
FIG. 14 is a schematic sectional side view of the thin film deposition assembly of FIG. 13.
Figure 15:
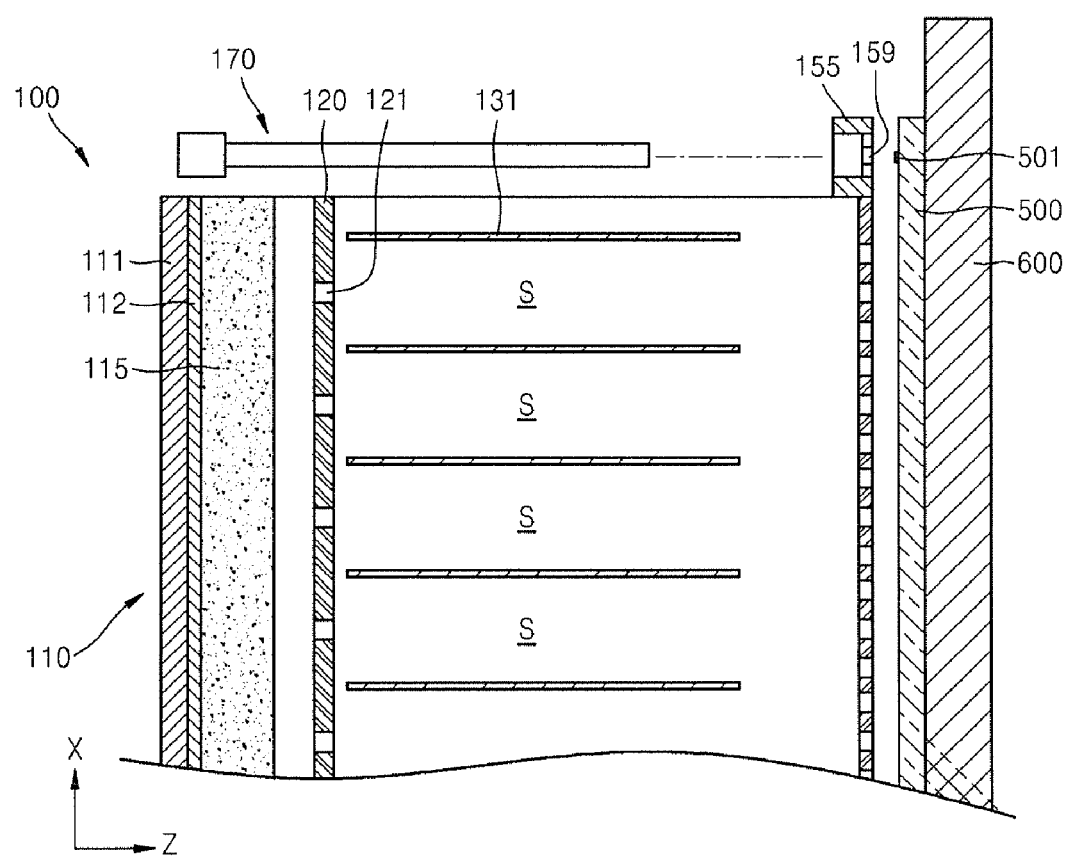
FIG. 15 is a schematic sectional plan view of the thin film deposition assembly of FIG. 13.

FIG. 13 is a schematic perspective view of a thin film deposition apparatus 100 according to another embodiment of the present invention. FIG. 14 is a schematic sectional side view of the thin film deposition apparatus 100. FIG. 15 is a schematic sectional plan view of the thin film deposition apparatus 100.

Referring to FIGS. 13 to 15, the thin film deposition assembly 100 according to the current embodiment includes a deposition source 110, a deposition source nozzle unit 120, a barrier plate assembly 130, and a patterning slit sheet 150.

Although a chamber is not illustrated in FIGS. 13 through 15 for convenience of explanation, all the components of the thin film deposition apparatus 100 may be disposed within a chamber that is maintained at an appropriate degree of vacuum. The chamber is maintained at an appropriate vacuum in order to allow a deposition material 115 to move in a substantially straight line through the thin film deposition apparatus 100.

A substrate 500 which is a deposition target is moved in the chamber by an electrostatic chuck 600. The substrate 500 may be a substrate for flat panel displays. A large substrate, such as a mother glass, for manufacturing a plurality of flat panel displays, may be used as the substrate 500.

In the current embodiment of the present invention, the substrate 500 or the thin film deposition assembly 100 is moved relative to the other. In particular, the substrate 500 may be moved with respect to the thin film deposition assembly 100 in a direction marked by an arrow A.

In the thin film deposition assembly 100 according to the current embodiment (and similar to the thin film deposition assembly 100 of FIG. 8), the patterning slit sheet 150 may be significantly smaller than an FMM used in a conventional deposition method. That is, in the thin film deposition assembly 100 according to the current embodiment, deposition is continuously performed, i.e., in a scanning manner while the substrate 500 is moved in the Y-axis direction. Thus, if the lengths of the patterning slit sheet 150 and the substrate 500 are the same in the X-axis direction, then a length of the pattering slit sheet 150 may be far less than a length of the substrate 500 in the Y-axis direction. However, even if the length of the patterning slit sheet 150 in the X-axis direction is less than the length of the substrate 500 in the X-axis direction, deposition may be performed over an entire surface of the substrate 500 since the manner in which the substrate 500 or the thin film deposition assembly 100 is moved relative to the other may be adapted.

As described above, since the patterning slit sheet 150 may be formed to be significantly smaller than an FMM used in a conventional deposition method, it is relatively easy to manufacture the patterning slit sheet 150. That is, using the patterning slit sheet 150, which is smaller than an FMM used in a conventional deposition method, is more convenient in all processes, including etching and subsequent other processes, such as precise extension, welding, moving, and cleaning processes, than using the larger FMM. Accordingly, the use of the patterning slit sheet 150 is more advantageous than the use of a conventional FMM for manufacturing a relatively large display device.

In the first chamber 731 of FIG. 1, the deposition source 110 that contains and heats the deposition material 115 is disposed to face the substrate 500.

The deposition source 110 according to the embodiment of FIGS. 12 through 14 includes a crucible 112 filled with the deposition material 115, and a cooling block 111 disposed to cover sides of the crucible 112. The cooling block 111 prevents heat generated from the crucible 112 from being conducted to the outside, i.e., toward the inside of the first chamber 731. The cooling block 111 includes a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged in the X-axis direction. The plurality of deposition source nozzles 121 may be arranged at equal intervals. The deposition material 115 that is vaporized in the deposition source 110, passes through the deposition source nozzles 121 of the deposition source nozzle unit 120 towards the substrate 500.

The barrier plate assembly 130 is disposed at a side of the deposition source nozzle unit 120 between the deposition source nozzle unit 120 and the patterning slit sheet 150. The barrier plate assembly 130 includes a plurality of barrier plates 131, and a barrier plate frame 132 that covers sides of the barrier plates 131. The plurality of barrier plates 131 may be arranged parallel to each other in X-axis direction. The plurality of barrier plates 131 may be arranged at equal intervals. In addition, the barrier plates 131 may be arranged parallel to an Y-Z plane in FIG. 13 and may have a rectangular shape. The plurality of barrier plates 131 arranged as described above partition a deposition space between the deposition source nozzle unit 120 and the patterning slit sheet 150 into a plurality of sub-deposition spaces S. That is, in the thin film deposition assembly 100 according to the current embodiment, as illustrated in FIG. 15, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the present invention is not limited thereto and a plurality of the deposition source nozzles 121 may be disposed between two adjacent barrier plates 131. In this case, a plurality of the deposition source nozzles 121 may be respectively located at the midpoint between two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 so as to be deposited on the substrate 500. In other words, the barrier plates 131 guide the deposition material 115, which is discharged through the deposition source nozzles 121, to move straight, not to deviate in the X-axis direction.

As described above, the deposition material 115 is forced to move straight by installing the barrier plates 131, so that a smaller shadow zone may be formed on the substrate 500 compared to a case where no barrier plates are installed. Thus, the thin film deposition assembly 100 and the substrate 500 can be spaced apart from each other by a predetermined distance. This will be described later in detail.

The barrier plate frame 132, which covers sides of the barrier plates 131, maintains the positions of the barrier plates 131, and guides the deposition material 115, which is discharged through the deposition source nozzles 121, and prevents deviation of the deposition material 115 in the Y-axis direction.

The deposition source nozzle unit 120 and the barrier plate assembly 130 may be disposed apart from each other by a predetermined distance. Accordingly, heat emitted from the deposition source 110 may be prevented from being conducted to the barrier plate assembly 130. However, the present invention is not limited thereto. That is, if an appropriate insulating device is installed between the deposition source nozzle unit 120 and the barrier plate assembly 130, the deposition source nozzle unit 120 and the barrier plate assembly 130 may be combined to contact each other.

In addition, the barrier plate assembly 130 may be constructed to be attachable to and detachable from the thin film deposition assembly 100. In order to overcome these problems, in the thin film deposition assembly 100 according to the current embodiment, the deposition space is enclosed by using the barrier plate assembly 130, so that the deposition material 115 that is not deposited on the substrate 500 is mostly deposited within the barrier plate assembly 130. Thus, since the barrier plate assembly 130 is constructed to be attachable to and detachable from the thin film deposition assembly 100, when a large amount of the deposition material 115 is present on surfaces of the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100 according to the present embodiment, a reuse rate of the deposition material 115 is increased, so that the deposition efficiency is improved, and thus the manufacturing costs are reduced.

The patterning slit sheet 150 and a frame 155 in which the patterning slit sheet 150 is bound are disposed between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged in the X-axis direction. Each of the patterning slits 151 extends in the Y-axis direction. The deposition material 115 that is vaporized in the deposition source 110, passes through the deposition source nozzles 121 towards the substrate 500.

The patterning slit sheet 150 may be embodied as a metal thin plate and is bound in the frame 155 when extended. The patterning slits 151 are formed in stripes in the patterning slit sheet 150 by using an etching process.

In the thin film deposition assembly 100 according to the current embodiment, the total number of the patterning slits 151 is greater than the total number of the deposition source nozzles 121. In addition, there may be a greater number of patterning slits 151 than deposition source nozzles 121 disposed between two adjacent barrier plates 131. The number of the patterning slits 151 may correspond to the number of deposition patterns to be formed in the substrate 500.

In addition, the barrier plate assembly 130 and the patterning slit sheet 150 may be disposed apart from each other by a predetermined distance. Alternatively, the barrier plate assembly 130 and the patterning slit sheet 150 may be connected by second connection members 133. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 may be disposed apart from each other by a predetermined distance.

As shown in FIGS. 13 and 15, the thin film deposition assembly 100 may also include one or more alignment devices 170 and one or more alignment targets 159 and 501 that assist in alignment of the patterning slit sheet 150 with respect to the substrate 500.

As described above, the thin film deposition assembly 100 according to the current embodiment performs deposition while the substrate 500 and the thin film deposition assembly 100 are moved relative to the other. In order to move the thin film deposition assembly 100 or the substrate 500 relative to the other, the patterning slit sheet 150 is spaced apart from the substrate 500 by a predetermined distance. In addition, in order to prevent the formation of a relatively large shadow zone on the substrate 500 when the patterning slit sheet 150 and the substrate 400 are separated from each other, the barrier plates 131 are arranged between the deposition source nozzle unit 120 and the patterning slit sheet 150 to force the deposition material 115 to move in a straight direction. Thus, the size of the shadow zone formed on the substrate 500 is sharply reduced.

In particular, in a conventional deposition method using an FMM, deposition is performed with the FMM in close contact with a substrate in order to prevent formation of a shadow zone on the substrate. However, when the FMM is used in close contact with the substrate, patterns that have been formed on the substrate may be scratched due to the contact, thereby causing defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 100 according to the current embodiment, the patterning slit sheet 150 is disposed apart from the substrate 500 by a predetermined distance. The formation of a desirable deposition pattern may be facilitated by installing the barrier plates 131 to reduce the size of the shadow zone formed on the substrate 500.

In the current embodiment, the patterning slit sheet 150 is formed to be smaller than the substrate 500 and to be moved relative to the substrate 500 as described above. Thus, a larger mask does not need to be manufactured unlike in a conventional deposition method using an FMM. In addition, defects caused due to the contact between a substrate and an FMM, which occurs in the conventional deposition method, are prevented since the substrate 500 and the patterning slit sheet 150 are disposed apart from each other. In addition, since it is unnecessary to dispose the patterning slit sheet 150 in close contact with the substrate 500 during a deposition process, the manufacturing speed may be improved.

A plurality of the thin film deposition assemblies 100 according to the current embodiment may be arranged consecutively within the first chamber 731 as illustrated in FIG. 1. In this case, different deposition materials may be deposited on the plurality of the thin film deposition assemblies 100, respectively, and patterning slits formed in the plurality of the thin film deposition assemblies 100 may have different patterns from one another. Accordingly, it is possible to simultaneously form a plurality of layers, for example, red, green, and blue pixels.

As shown in FIG. 12, the thin film deposition assembly 100 may also include one or more alignment devices 170 and one or more alignment targets 159 that assist in alignment of the patterning slit sheet 150 with respect to the substrate 100.

Figure 16:
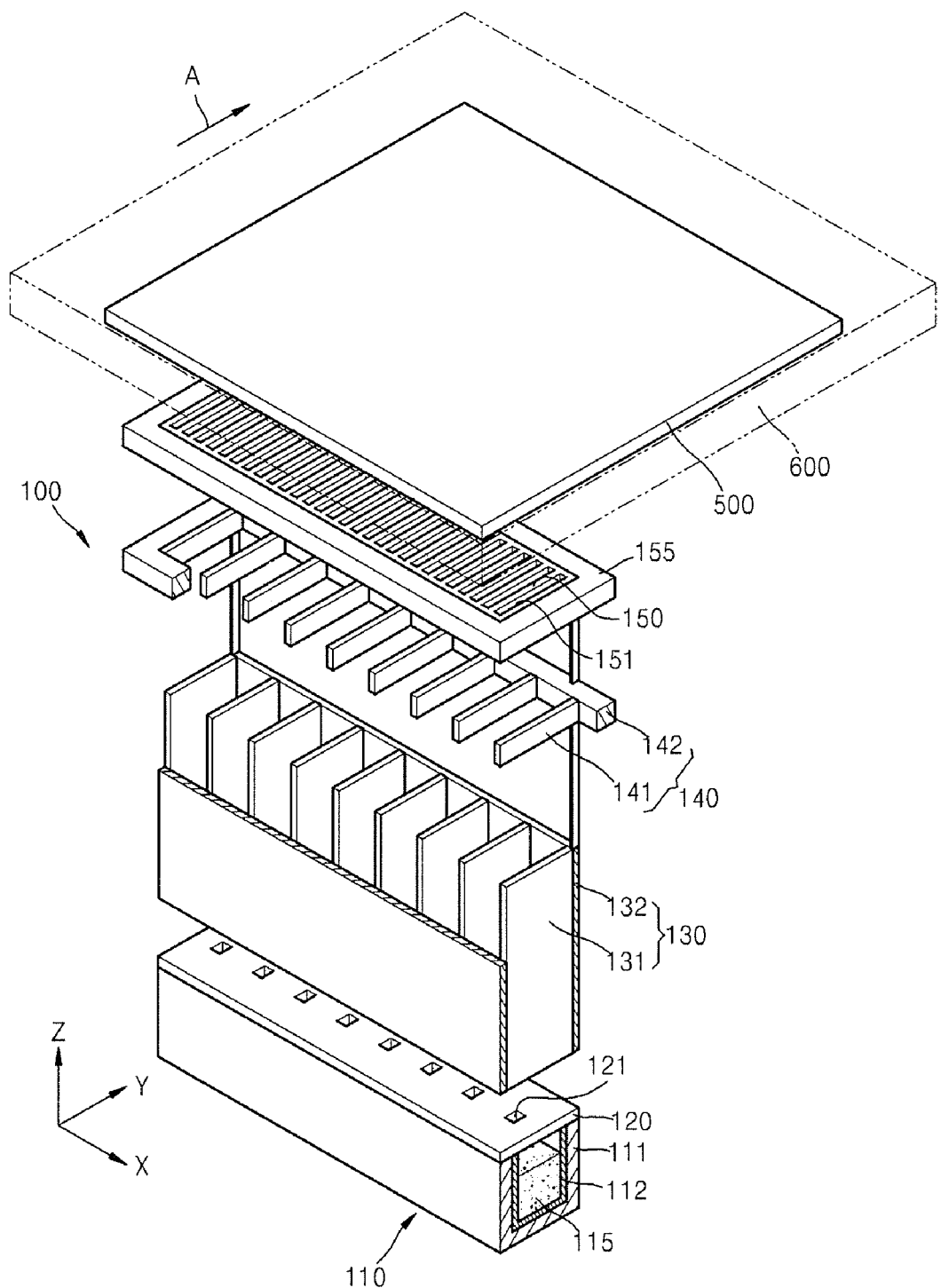
FIG. 16 is a perspective view of a thin film deposition assembly according to another embodiment of the present invention.

FIG. 16 is a schematic perspective view of a modified example of the thin film deposition assembly 100 of FIG. 13.

Referring to FIG. 16, the thin film deposition assembly 100 according to the current embodiment includes a deposition source 110, a deposition source nozzle unit 120, a first barrier plate assembly 130, a second barrier plate assembly 140, and a patterning slit sheet 150.

Although a chamber is not illustrated in FIG. 16 for convenience of explanation, all the components of the thin film deposition assembly 100 may be disposed within a chamber that is maintained at an appropriate degree of vacuum.

The chamber is maintained at an appropriate vacuum in order to allow a deposition material to move in a substantially straight line through the thin film deposition assembly 100.

The substrate 500, which constitutes a target on which a deposition material 115 is to be deposited, is disposed in the chamber. The deposition source 115 that contains and heats the deposition material 115 is disposed in an opposite side of the chamber to the side in which the substrate 500 is disposed.

Detailed structures of the deposition source 110 and the patterning slit sheet 150 are the same as those of FIG. 13 and thus, detailed descriptions thereof will not be repeated here. The first barrier plate assembly 130 is the same the barrier plate assembly 130 of FIG. 13 and thus, a detailed description thereof will not be repeated here.

The second barrier plate assembly 140 is disposed at a side of the first barrier plate assembly 130. The second barrier plate assembly 140 includes a plurality of second barrier plates 141 and a second barrier plate frame 141 that constitutes an outer plate of the second barrier plates 142.

The plurality of second barrier plates 141 may be arranged parallel to each other at equal intervals in the X-axis direction. In addition, each of the second barrier plates 141 may be formed to extend in the YZ plane in FIG. 14, i.e., perpendicular to the X-axis direction.

The plurality of first barrier plates 131 and second barrier plates 141 arranged as described above partition the space between the deposition source nozzle unit 120 and the patterning slit sheet 150. The deposition space is divided by the first barrier plates 131 and the second barrier plates 141 into sub-deposition spaces that respectively correspond to the deposition source nozzles 121 through which the deposition material 115 is discharged.

The second barrier plates 141 may be disposed to correspond to the first barrier plates 131. The second barrier plates 141 may be respectively disposed to be parallel to and to be on the same plane as the first barrier plates 131. Each pair of the corresponding first and second barrier plates 131 and 141 may be located on the same plane. Although the first barrier plates 131 and the second barrier plates 141 are respectively illustrated as having the same thickness in the Y-axis direction, aspects of the present invention are not limited thereto. The second barrier plates 141, which may be accurately aligned with the patterning slit sheet 151, may be formed to be relatively thin, whereas the first barrier plates 131, which do not need to be precisely aligned with the patterning slit sheet 151, may be formed to be relatively thick. This makes it easier to manufacture the thin film deposition assembly 100.

Figure 17:
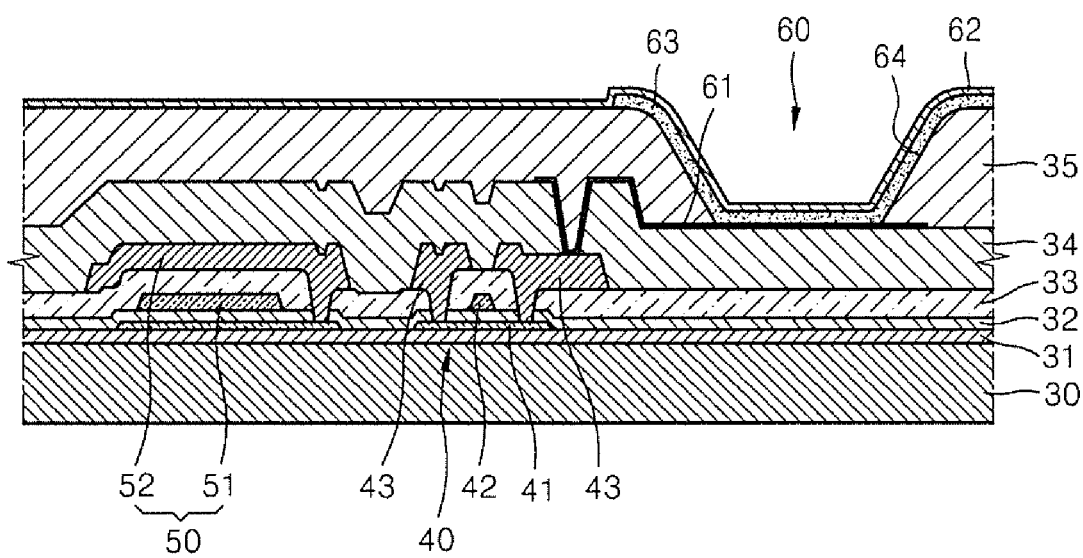
FIG. 17 is a cross-sectional view of an organic light-emitting display device manufactured using a thin film deposition assembly, according to an embodiment of the present invention.

FIG. 17 is a cross-sectional view of an active matrix organic light-emitting display device manufactured using a thin film deposition apparatus according to an embodiment of the present invention. It is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process. Referring to FIG. 17, the active matrix organic light-emitting display device is formed on a substrate 30. The substrate 30 may be formed of a transparent material, e.g., glass, plastic, or metal. An insulation layer 31, such as buffer layer, may be formed on the substrate 30.

A thin film transistor (TFT) 40, a capacitor 50, and an organic light-emitting device 60 are disposed on the insulating layer 31 as illustrated in FIG. 16.

A semiconductor active layer 41 is formed in a predetermined pattern on the insulating layer 31. The semiconductor active layer 41 is covered by a gate insulating layer 32. The semiconductor active layer 41 may be embodied as a p type or n type semiconductor layer.

A gate electrode 42 of the TFT 40 is formed on a part of the gate insulating layer 32 which corresponds to the active layer 41. Also, an interlayer insulating layer 33 is formed to cover the gate electrode 42. After the interlayer insulating layer 33 is formed, a plurality of contact holes are formed by etching the gate insulating layer 32 and the interlayer insulating layer 33 according to an etching process, e.g., a dry etching process, thereby partially exposing the active layer 41.

A source/drain electrode 43 is formed on the interlayer insulating layer 33 to contact the parts of the active layer 41 exposed via the contact holes. Next, a protective layer 34 is formed to cover the source/drain electrode 43, and the drain electrode 43 is partially exposed using an etching process. An insulating layer may further be formed on the protective layer 34 in order to planarize the protective layer 34.

The organic light-emitting device 60 emits red, green, or blue light depending on the flow of current in order to display image information, and a first electrode 61 is formed on the protective layer 34. The first electrode 61 is electrically connected to the drain electrode 43 of the TFT 40.

A pixel defined layer 35 is formed to cover the first electrode 61. After a predetermined aperture 64 is formed in the pixel defined layer 35, an organic light-emitting layer 63 is formed in a region defined by the aperture 64. A second electrode 62 is formed on the organic light-emitting layer 63.

The pixel defined layer 35 is used to define a plurality of pixels. The pixel defined layer 35 is formed of an organic material to planarize a surface of a layer on which the first electrode 61 is disposed, and in particular, a surface of the protective layer 34.

The first electrode 61 and the second electrode 62 are insulated from each other, and respectively apply voltages of opposite polarities to the organic light-emitting layer 63 to induce light emission in the organic light-emitting layer 63.

The organic light-emitting layer 63 may include a low-molecular weight organic layer or a high-molecular weight organic layer. When a low-molecular weight organic layer is used as the organic light-emitting layer 63, the organic light-emitting layer 63 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials include copper phthalocyanine (CuPc), N,N'-di(naphthalene-1-yl)-N,N'-diphenyl-benzidine (NPB), tris-8-hydroxyquinoline aluminum (Alq3), etc. These low-molecular weight organic layers may be formed according to a vacuum deposition method by using a thin film deposition apparatus as illustrated in FIGS. 1 to 16.

The aperture 64 is formed in the pixel defined layer 35, and the substrate 30 is moved within the first chamber 731 as illustrated in FIG. 1. Next, a target organic materials are deposited by the first to fourth thin film deposition assemblies 100 to 400.

After the organic light-emitting layer 63 is formed, the second electrode 62 may also be formed in a similar manner to the organic light-emitting layer 63.

The first electrode 61 may function as an anode and the second electrode 62 may function as a cathode, or vice versa. The first electrode 61 may be patterned to correspond to a plurality of pixel regions and the second electrode 62 may be formed to cover all the pixel regions.

The pixel electrode 61 may be formed as a transparent electrode or a reflective electrode. A transparent electrode may be formed of an indium tin oxide (ITO), an indium zinc oxide (IZO), a zinc oxide (ZnO), or an indium oxide ($In_2O_3$). A reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and then forming a layer of ITO, IZO, ZnO, or $In_2O_3$ on the reflective layer. The first electrode 61 is obtained by forming a layer according to a sputtering method and by patterning the layer according to a photolithography process.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic light-emitting layer 63 and then forming an auxiliary electrode layer or a bus electrode line thereon by using ITO, IZO, ZnO, $In_2O_3$, or the like. When the second electrode 62 is formed as a reflective electrode, the second electrode 62 may be formed by depositing Li, Ca, LiF/Ca, LiF/Al, Al, Ag, Mg, or a compound thereof on the entire surface of the organic light-emitting layer 63. In this case, deposition may be performed in a similar manner to the organic light-emitting layer 63.

In addition, embodiments of the present invention can be used not only to form an organic or inorganic layer for an organic TFT but also to form layers of various materials for various purposes. Moreover, it is to be understood that the structure of an active matrix organic light-emitting display device fabricated using a thin film deposition apparatus according to embodiments of the present invention may vary from what is shown in FIG. 17.

As described above, according to the above embodiments of the present invention, a thin film deposition apparatus and a method of easily manufacturing an organic light-emitting display device using the same are provided. The thin film deposition apparatus may be simply applied to manufacture large display devices on a mass scale, and may improve manufacturing yield and deposition efficiency. Also, an electrostatic chuck may be used to stably support a large substrate, that is, to prevent the substrate from sagging, and may be used to smoothly move a substrate from one chamber to another chamber.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting device, the method comprising:
    affixing a substrate which is a deposition target to an electrostatic chuck, wherein the electrostatic chuck comprises a body having a supporting surface that contacts the substrate to affix the substrate by an electrostatic force, an electrode embedded into the body and applying an electrostatic force to the supporting surface, and a plurality of power source holes that are formed to expose the electrode and that are formed at different locations on the body;
    moving the electrostatic chuck supporting the substrate to pass through a plurality of chambers that are maintained in a vacuum state, wherein at least one of a plurality of power source plugs is engaged with a power source hole of the plurality of power source holes at all times when the substrate is supported by the electrostatic chuck and when the electrostatic chuck passes through the plurality of chambers;
    inserting a first power source plug of the plurality of power source plugs into a first power source hole selected from among the plurality of power source holes to supply power to the electrode, where the first power source plug is installed at an upstream of a path in which the electrostatic chuck is moved;
    inserting a second power source plug of the plurality of power source plugs into a second power source hole selected from among the plurality of power source holes to supply power to the electrode, where the second power source plug is installed in the path to be downstream to the first power source plug with respect to the path;
    separating the first power source plug from the first power source hole; and
    forming an organic layer on the substrate by using a thin film deposition assembly disposed in at least one of the plurality of chambers and by moving the electrostatic chuck supporting the substrate or the thin film deposition assembly relative to the other.

2. The method of claim 1, wherein the first and second power source plugs are disposed in different chambers, and the second power source plug is inserted into the second power source hole at about the same time that the first power source plug is separated from the first power source hole.

3. The method of claim 1, wherein an inversion robot is located in at least one of the plurality of chambers to turn over the electrostatic chuck that supports the substrate, and
    the method further comprising:
    inserting a third power source plug installed in the inversion robot into a third power source hole selected from among the plurality of power source holes; and
    separating the third power source plug from the third power source hole when the first power source or second power source is inserted into the first or second power source hole, respectively.

4. The method of claim 1, wherein the thin film deposition assembly comprises:
    a deposition source that discharges a deposition material;
    a deposition source nozzle unit disposed at a side of the deposition source and including a plurality of deposition source nozzles arranged in a first direction; and
    a patterning slit sheet disposed opposite to and spaced apart from the deposition source nozzle unit and including a plurality of patterning slits arranged in a second direction perpendicular to the first direction,
    wherein the deposition source, the deposition source nozzle unit, and the patterning slit sheet are integrally formed as one body, and
    the thin film deposition assembly is disposed apart from the substrate so that the depositing of the deposition material is performed while the substrate is moved relative to the thin film deposition apparatus in the first direction.

5. The method of claim 1, wherein the thin film deposition assembly comprises:
    a deposition source that discharges a deposition material;
    a deposition source nozzle unit disposed at a side of the deposition source and including a plurality of deposition source nozzles arranged in a first direction;
    a patterning slit sheet disposed opposite to and spaced apart from the deposition source nozzle unit and including a plurality of patterning slits arranged in the first direction; and
    a barrier plate assembly disposed between the deposition source nozzle unit and the patterning slit sheet in the first direction, and including a plurality of barrier plates for partitioning a deposition space between the deposition source nozzle unit and the patterning slit sheet into a plurality of sub-deposition spaces,
    wherein the thin film deposition assembly is disposed apart from the substrate so that the depositing of the deposition material is performed on the substrate by moving the thin film deposition assembly or the substrate relative to the other.

6. A method of manufacturing an organic light-emitting device, the method comprising:
    affixing a substrate which is a deposition target to an electrostatic chuck,
    wherein the electrostatic chuck comprises a body having a supporting surface that contacts the substrate to affix the substrate by an electrostatic force, an electrode embedded into the body and applying an electrostatic force to the supporting surface, and a plurality of power source holes that are formed to expose the electrode and that are formed at different locations on the body;

moving the electrostatic chuck to which the substrate is affixed along a predetermined path to pass through a plurality of chambers that are maintained in a vacuum state;

supplying power to the electrode of the electrostatic chuck by engaging the electrostatic chuck with one or more of a plurality of power source plugs arranged along the predetermined path and sequentially inserted into and removed from the power source holes such that there is at least one of the plurality of power source plugs engaged with a power source hole at all times when the substrate is affixed to the electrostatic chuck and when the electrostatic chuck passes through the plurality of chambers; and forming an organic layer on the substrate depositing a deposition material from at least one thin film deposition assembly disposed in at least one of the plurality of chambers as the substrate moves through the at least one of the plurality of chambers.

* * * * *